(12) United States Patent
Toyoda

(10) Patent No.: US 9,806,592 B2
(45) Date of Patent: Oct. 31, 2017

(54) POWER GENERATING DEVICE

(71) Applicant: FUJITSU LIMITED, Kawasaki-shi, Kanagawa (JP)

(72) Inventor: Osamu Toyoda, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 749 days.

(21) Appl. No.: 14/309,109

(22) Filed: Jun. 19, 2014

(65) Prior Publication Data

US 2014/0300216 A1    Oct. 9, 2014

Related U.S. Application Data

(63) Continuation of application No. PCT/JP2012/058707, filed on Mar. 30, 2012.

(30) Foreign Application Priority Data

Jan. 12, 2012  (JP) .................................. 2012-004206

(51) Int. Cl.
  *H02N 10/00*  (2006.01)
  *H02K 33/00*  (2006.01)
  *H01L 41/12*  (2006.01)
  *H02N 2/18*  (2006.01)

(52) U.S. Cl.
  CPC ........... *H02K 33/00* (2013.01); *H01L 41/125* (2013.01); *H02N 2/186* (2013.01)

(58) Field of Classification Search
  CPC ........... H02K 33/00; H02N 3/00; H02N 10/00
  USPC ................................. 310/303, 306, 309, 308
  See application file for complete search history.

(56) References Cited

U.S. PATENT DOCUMENTS

| | | | | |
|---|---|---|---|---|
| 3,614,677 A | * | 10/1971 | Wilfinger | ................ H01L 27/00 257/416 |
| 4,339,247 A | * | 7/1982 | Faulkner | ............ B01D 19/0078 95/30 |
| 7,345,372 B2 | * | 3/2008 | Roberts | ..................... F03G 7/08 290/1 A |
| 8,013,497 B2 | | 9/2011 | Fujimoto | |

(Continued)

FOREIGN PATENT DOCUMENTS

| | | |
|---|---|---|
| CN | 101621258 A | 1/2010 |
| JP | H09-90065 | 4/1997 |

(Continued)

OTHER PUBLICATIONS

Office Action of Chinese Patent Application No. 201280065896.0 dated Jul 29, 2016; English translation.

(Continued)

*Primary Examiner* — Hanh Nguyen
(74) *Attorney, Agent, or Firm* — Kratz, Quintos & Hanson, LLP

(57) ABSTRACT

There are included: an oscillating member that includes a tough layer and a magnetostrictive layer stacked above the tough layer and formed of a magnetostrictive material, the tough layer formed of a tough material having a tensile strength higher than that of the magnetostrictive material; a supporting member to which the oscillating member is attached to be able to oscillate in the thickness direction; a magnetic field applying member that applies a magnetic field to the magnetostrictive layer; and a coil that is disposed around the magnetostrictive layer.

23 Claims, 31 Drawing Sheets

(56) References Cited

U.S. PATENT DOCUMENTS

| | | | | |
|---|---|---|---|---|
| 2001/0045880 A1* | 11/2001 | Czimmek | ............... | F16K 31/02 |
| | | | | 335/215 |
| 2009/0315335 A1* | 12/2009 | Ujihara | .................. | F03G 7/065 |
| | | | | 290/1 R |
| 2010/0302041 A1* | 12/2010 | Malik | .................... | G08B 21/04 |
| | | | | 340/573.1 |
| 2011/0057458 A1* | 3/2011 | Lee | ......................... | H01L 41/00 |
| | | | | 290/1 R |

FOREIGN PATENT DOCUMENTS

| | | | |
|---|---|---|---|
| JP | 2006-521198 A1 | 9/2006 | |
| JP | 2010-206950 A1 | 9/2010 | |
| WO | WO 2004/078367 A1 | 9/2004 | |
| WO | WO 2010/029715 A1 | 3/2010 | |
| WO | WO 2011/158473 A1 | 12/2011 | |

OTHER PUBLICATIONS

Shonan-metaltec Corporation; "Introduction of inverse magnetostriction type vibration power generator of SMT development" http://www.shonan-metaltec.com/HPdata/info_gyakujiwai_hatudenki.pdf; Nov. 8, 2011; (2 Sheets, including one page partial translation and one sheet of drawings)/p. 2 of specification.

T. Ueno; "Micro energy harvesting device using magnetostrictive material;" Kanazawa University New Technology Presentation Meetings; http://jstshingi.jp/abst/p/10/1022/kanazawa1.pdf; Aug. 6, 2010 (23 Sheets)/p. 2 of specification.

International Search Report for International Application No. PCT/JP2012/058707 dated Jul. 3, 2012.

Office Action of Chinese Patent Application No. 201280065896.0 dated Dec. 16, 2005, with full translation of the Office Action.

\* cited by examiner

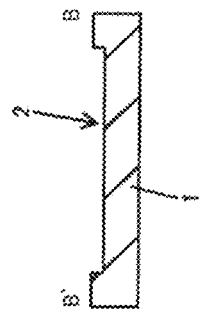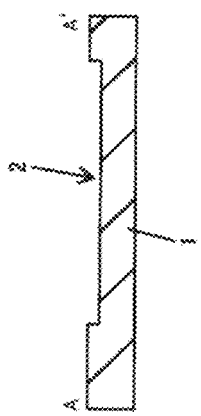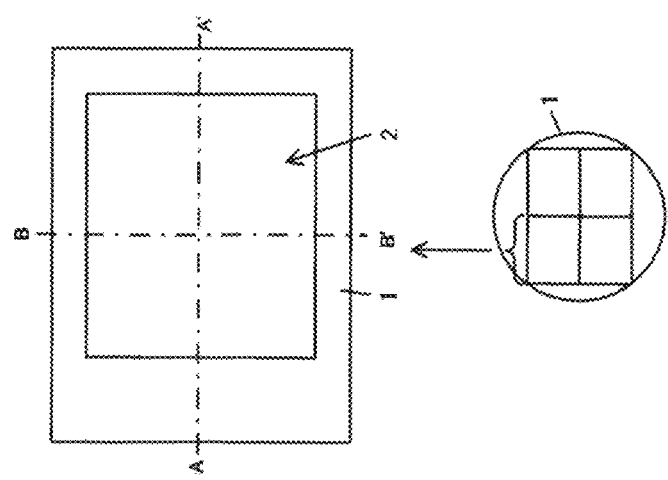

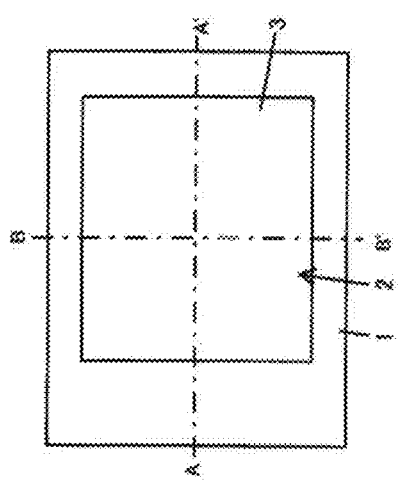
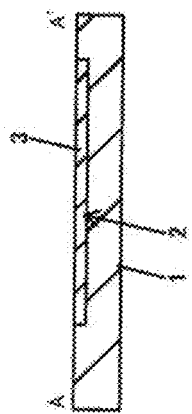
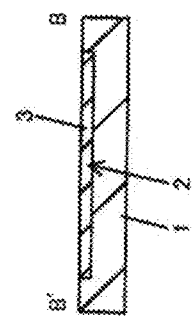

FIG. 4A
FIG. 4B
FIG. 4C
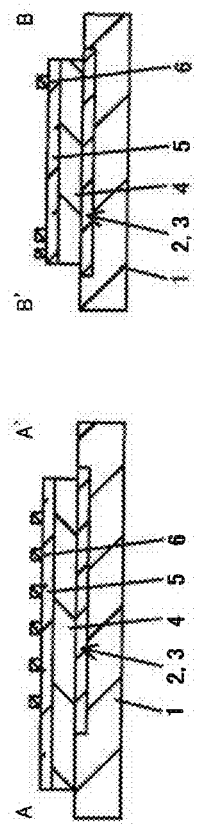
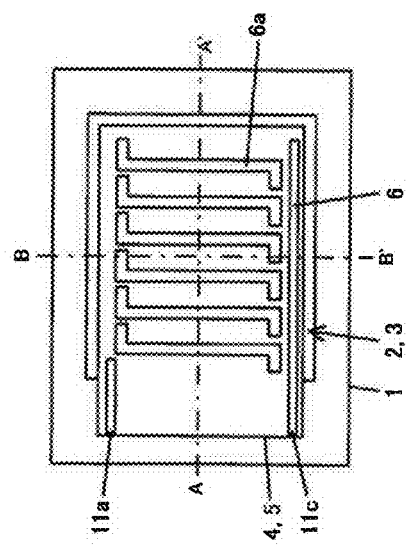

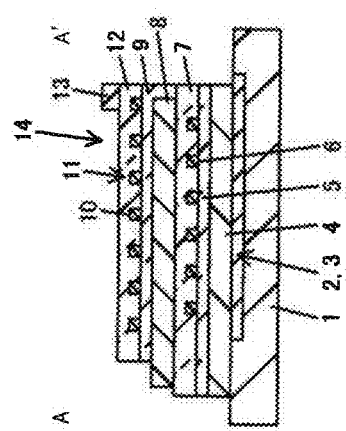
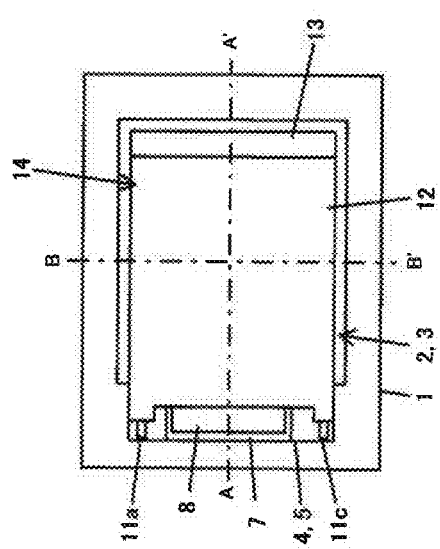
FIG. 7A  FIG. 7B  FIG. 7C

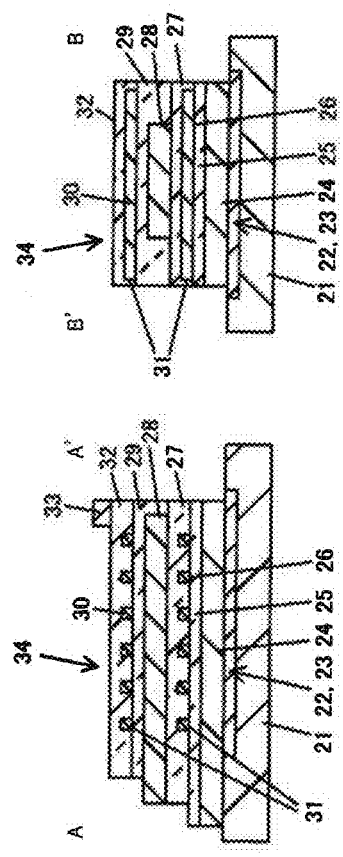
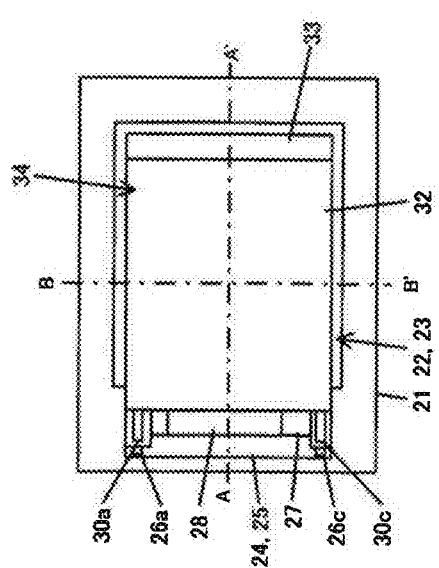
FIG. 16A  FIG. 16B  FIG. 16C

FIG. 17A
FIG. 17B
FIG. 17C
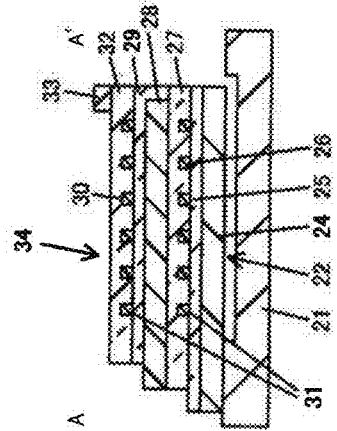
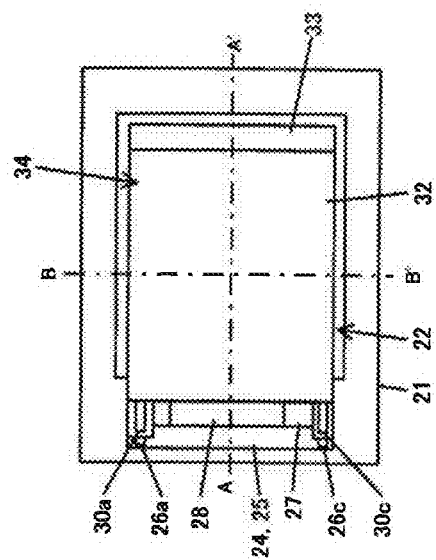

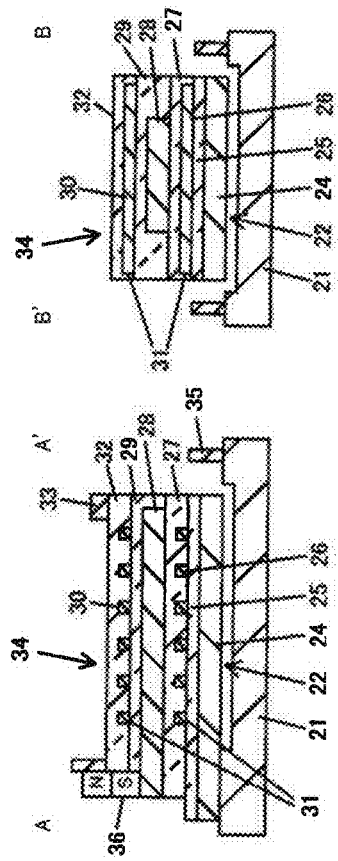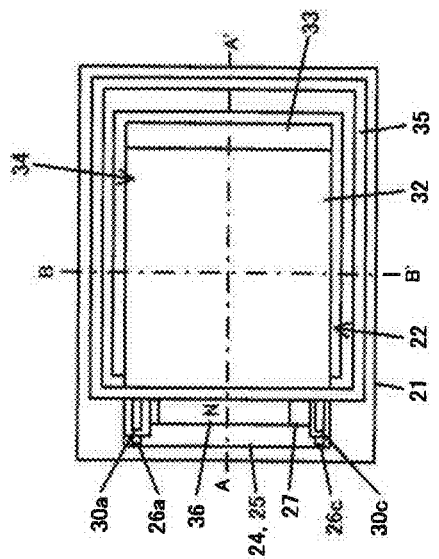

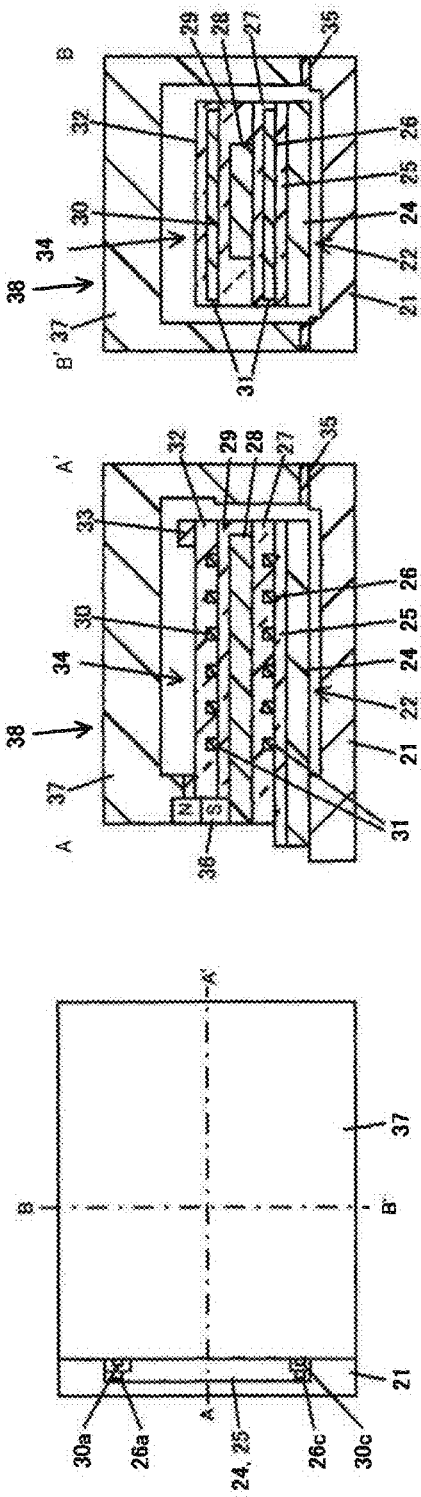

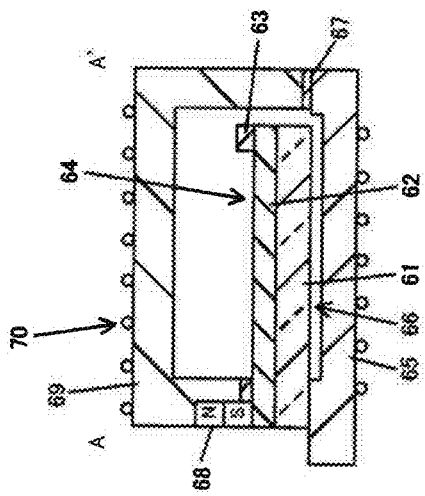
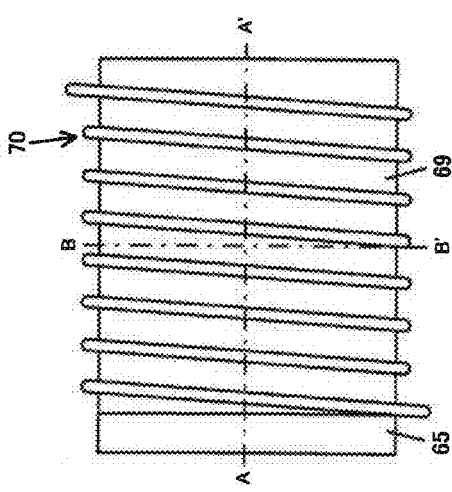

FIG. 27

| | TENSILE STRENGTH (MPa) | FATIGUE STRENGTH (MPa) | YOUNG'S MODULUS (GPa) | ELASTIC LIMIT ELONGATION (%) |
|---|---|---|---|---|
| METALS (IRON·COPPER AND SO ON) | 100~200 | 35~65 | 150-200 | 0.65~1.00 |
| METALLIC GLASS | 1000~3000 | 350~1000 | 50-80 | ~2.0 |
| SUPERELASTIC ALLOY | 1200~1400 | 400~450 | 8-10 | ~10.0 |
| Si SINGLE CRYSTAL | 13000 | ~3500 | 150 | |

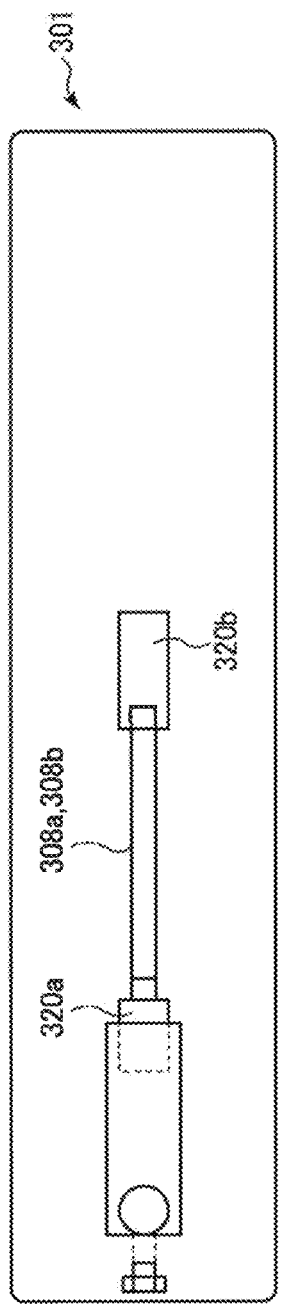
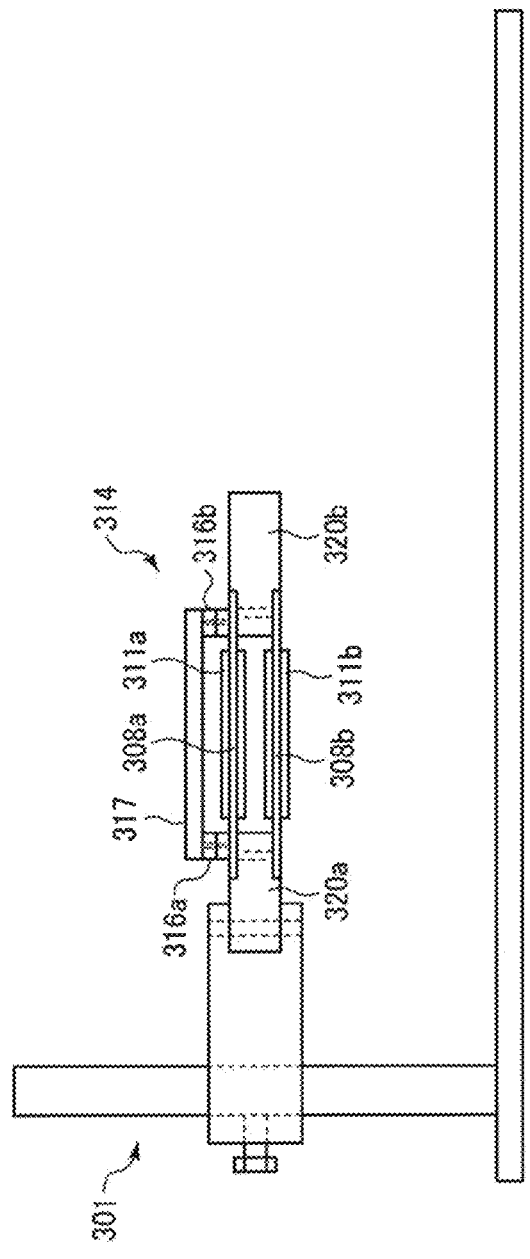
FIG. 31A
FIG. 31B

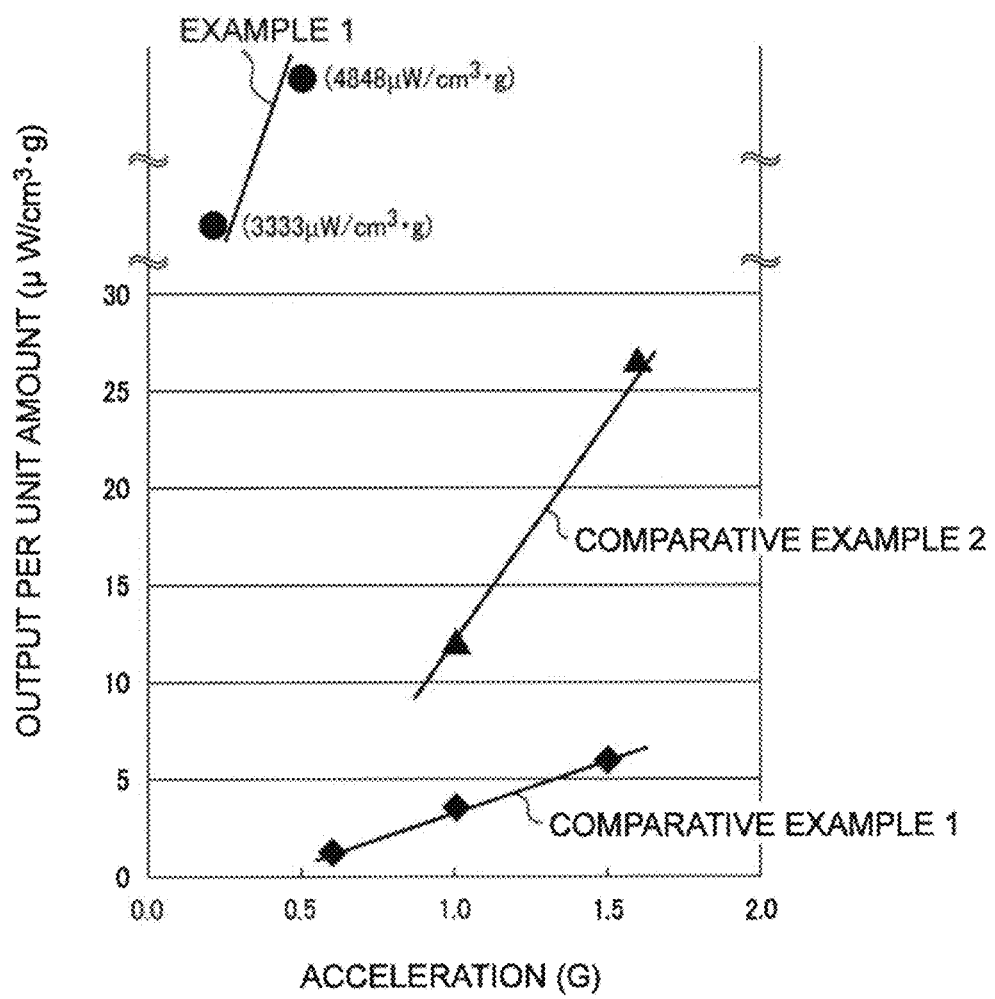

POWER GENERATING DEVICE

CROSS-REFERENCE TO RELATED APPLICATION

This application is a continuation application of International Application PCT/JP2012/058707 filed on Mar. 30, 2012 and designated the U.S., which claims the benefit of priority of the prior Japanese Patent Application No. 2012-004206, filed on Jan. 12, 2012, the entire contents of which are incorporated herein by reference.

FIELD

The present embodiments discussed herein are directed to a power generated device.

BACKGROUND

A magnetostriction phenomenon is a phenomenon in which a magnetic body is deformed by a magnetic field applied externally. A magnetostrictive material exhibiting the magnetostriction phenomenon is subjected to deformation in a state of an external magnetic field being applied thereto, and thereby magnetization inside the magnetostrictive material changes. This phenomenon is called an inverse magnetostriction phenomenon or a Villari effect. A power generating device using the inverse magnetostriction phenomenon has been proposed (see Non-Patent Documents 1 and 2, for example).

Non-Patent Document 1: Shonan-metaltec Corporation, "Introduction of inverse magnetostriction type vibration power generator of SMT development," [online], [search on Nov. 8, 2011] Internet <URL: http://www.shonan-metaltec.com/HPdata/info_gyakujiwai_hatudenki.pdf>

Non-Patent Document 2: UENO, Toshiyuki, "Micro energy harvesting device using magnetostrictive material," [online], Aug. 6, 2010, Kanazawa University New Technology Presentation Meetings [search on Nov. 8, 2011] Internet <URL: http://jstshingi.jp/abst/p/10/1022/kanazawa1.pdf>

SUMMARY

According to one aspect of the present embodiments, there is provided a power generating device including: an oscillating member that includes a tough layer, and a magnetostrictive layer that is stacked above the tough layer and is formed of a magnetostrictive material, the tough layer formed of a tough material having a tensile strength higher than that of the magnetostrictive material; a supporting member to which the oscillating member is attached to be able to oscillate in the thickness direction; a magnetic field applying member that applies a magnetic field to the magnetostrictive layer; and a coil that is disposed around the magnetostrictive layer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A is a schematic plan view illustrating a main manufacturing step of a vibration power generating device according to a first embodiment;

FIG. 1B is a cross-sectional view in the A-A' direction illustrated in FIG. 1A;

FIG. 1C is a cross-sectional view in the B-B' direction illustrated in FIG. 1A;

FIG. 2A is a schematic plan view illustrating a main manufacturing step of the vibration power generating device according to the first embodiment;

FIG. 2B are a cross-sectional view in the A-A' direction illustrated in FIG. 2A;

FIG. 2C is a cross-sectional view in the B-B' direction illustrated in FIG. 2A;

FIG. 4A is a schematic plan view illustrating a main manufacturing step of the vibration power generating device according to the first embodiment;

FIG. 4B is a cross-sectional view in the A-A' direction illustrated in FIG. 4A;

FIG. 4C is a cross-sectional view in the B-B' direction illustrated in FIG. 4A;

FIG. 7A is a schematic plan view illustrating a main manufacturing step of the vibration power generating device according to the first embodiment;

FIG. 7B is a cross-sectional view in the A-A' direction illustrated in FIG. 7A;

FIG. 7C is a cross-sectional view in the B-B' direction illustrated in FIG. 7A;

FIG. 16A is a schematic plan view illustrating a main manufacturing step of the vibration power generating device according to the second embodiment;

FIG. 16B is a cross-sectional view in the A-A' direction illustrated in FIG. 16A;

FIG. 16C is a cross-sectional view in the B-B' direction illustrated in FIG. 16A;

FIG. 17A is a schematic plan view illustrating a main manufacturing step of the vibration power generating device according to the second embodiment;

FIG. 17B is a cross-sectional view in the A-A' direction illustrated in FIG. 17A;

FIG. 17C is a cross-sectional view in the B-B' direction illustrated in FIG. 17A;

FIG. 18A is a schematic plan view illustrating a main manufacturing step of the vibration power generating device according to the second embodiment;

FIG. 18B is a cross-section view in the A-A' direction illustrated in FIG. 18A;

FIG. 18C is a cross-sectional view in the B-B' direction illustrated in FIG. 18A;

FIG. 19A is a schematic plan view illustrating a main manufacturing step of the vibration power generating device according to the second embodiment;

FIG. 19B is a cross-sectional view in the A-A' direction illustrated in FIG. 19A;

FIG. 19C is a cross-sectional view in the B-B' direction illustrated in FIG. 19A;

FIG. 26A is a schematic plan view illustrating a main manufacturing step of the vibration power generating devices according to the fourth embodiment;

FIG. 26B is a cross-sectional view in the A-A' direction illustrated in FIG. 26A;

FIG. 26C is a cross-sectional view in the B-B' direction illustrated in FIG. 26A;

FIG. 27 is a table where tensile strength, fatigue strength, Young's modulus, and elastic limit elongation of various materials are summarized;

FIG. 31A and FIG. 31B are a plan view and a side view illustrating a vibration power generating device according to Comparative example 2; and FIG. 32 is a graph illustrating the relationship between acceleration of vibration and output per unit amount.

DESCRIPTION OF EMBODIMENTS

First Embodiment

Figures 3A, 3B, 3C:
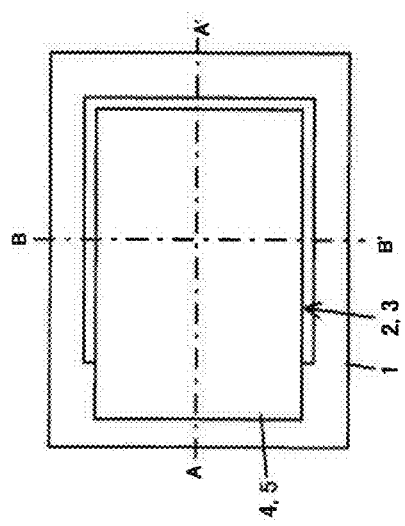
FIG. 3A is a schematic plan view illustrating a main manufacturing step of the vibration power generating device according to the first embodiment.
FIG. 3B is a cross-sectional view in the A-A' direction illustrated in FIG. 3A.
FIG. 3C is a cross-sectional view in the B-B' direction illustrated in FIG. 3A.

First, there is explained a manufacturing method of a vibration power generating device (a power generating device) according to a first embodiment. FIG. 1A to FIG. 10A are schematic plan views each illustrating a main manufacturing step of the vibration power generating device according to the first embodiment. FIG. 1B to FIG. 10B are schematic cross-sectional views taken along the dot and chain line in the A-A' direction of the plan views in FIG. 1A and the like (the right and left direction of the paper). FIG. 1C to FIG. 10C are schematic cross-sectional views taken along the dot and chain line in the B-B' direction of the plan views in FIG. 1A and the like (the up and down direction of the paper).

As will be described later, in each of the plan views in FIG. 1A and the like, the left side and the right side in the A-A' direction are a root side (a fixed end side) and a tip side (a movable end side) of an oscillating member 14 supported by a cantilever structure respectively. In the A-A' direction, the left side is called the root side, the right side is called the tip side, and the A-A' direction is called a length direction. Further, the B-B' direction is called a width direction.

FIG. 1A, FIG. 1B, and FIG. 1C are seen as reference. There is explained an example where as a supporting substrate 1, a silicon wafer having a diameter of about 100 mm (4 inches) and a thickness of 500 μm is used and on the single silicon wafer 1, four vibration power generating devices (four chips) each having a size of about 40 mm×about 30 mm are formed simultaneously. In the lower portion of FIG. 1A, a layout example of the four chips on the silicon wafer 1 is illustrated. Hereinafter, while illustrating the single chip as a representative, the explanation of the manufacturing method is carried forward.

On the silicon wafer 1, a resist pattern covering the outside of a recessed portion (a counterbore portion) 2 is formed and wet etching with KOH is performed to form the recessed portion 2. The recessed portion 2 has a rectangular shape having a length in the A-A' direction of 25 mm and a width in the B-B' direction of 20 mm, for example, and has a depth of 300 μm. After the formation of the recessed portion 2, the resist pattern is removed.

Incidentally, when an amplitude of the oscillating member is large, the counterbore only needs to be made deep accordingly, but when the counterbore is deep, ones each obtained by cutting a substrate material such as silicon into a desired shape may also be superimposed and bonded to be used.

FIG. 2A, FIG. 2B, and FIG. 2C are seen as reference. On the whole surface, a Ti layer having a thickness of 50 nm is formed by sputtering, and on the Ti layer, a Cu seed layer having a thickness of 200 nm is formed. A resist pattern covering the outside of the recessed portion 2 is formed, end by electrolytic plating, Cu is deposited to fill the recessed portion 2 to form a Cu layer 3. After the formation of the Cu layer 3, the resist pattern is removed. Next, the Cu seed layer and the Ti layer remaining on the top surface of the wafer 1 outside the recessed portion 2 are removed by ion milling. Incidentally, the surface is more desirably polished in order to improve smoothness.

FIG. 3A, FIG. 3B, and FIG. 3C are seen as reference. On the silicon wafer 1, a resist pattern covering the outside of a formation region of a tough layer 4 and an insulating layer 5 is formed. On the whole surface, a PdCuSi-based metallic glass layer having a thickness of 3 μm is deposited by sputtering, for example. Subsequently, on the metallic glass layer, a silicon oxide layer having a thickness of 100 nm is deposited by sputtering, for example. By liftoff to remove an unnecessary portion of the metallic glass layer and the silicon oxide layer together with the resist pattern, the tough layer 4 made of metallic glass and the insulating layer 5 made of silicon oxide are formed.

The tough layer 4 and the insulating layer 5 each have a rectangular shape having a length in the A-A' direction of 29 mm and a width in the B-B' direction of 18 mm, for example, and are formed so as to project above the recessed portion 2, namely to the tip side from the top surface of the silicon wafer 1 in the vicinity of an edge portion of the recessed portion 2 at the root side. As illustrated in FIG. 3A, in the projecting portion of the tough layer 4 and the insulating layer 5, an edge portion of the recessed portion 2 (an edge portion of the Cu layer 3) is exposed around the tough layer 4 and the insulating layer 5.

FIG. 4A, FIG. 4B, and FIG. 4C are seen as reference. A resist pattern covering the outside of a formation region of a coil lower layer portion 6 is formed. On the whole surface, a Cu layer having a thickness of 1 μm is formed by sputtering, for example. By liftoff to remove an unnecessary portion of the Cu layer together with the resist pattern, the coil lower layer portion 6 is formed on the insulating layer 5.

Figure 6A:
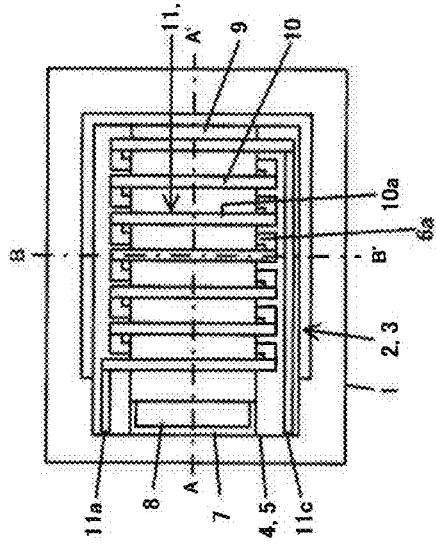
FIG. 6A is a schematic plan view illustrating a main manufacturing step of the vibration power generating device according to the first embodiment.

The coil lower layer portion 6 constitutes part of a coil 11 to be completed in steps to be described later with reference to FIG. 6A, FIG. 6B, and FIG. 6C. As illustrated in FIG. 6A, the coil 11 includes lead-out wire portions 11a and 11c at both sides of the coil and a coil main portion 11b.

The coil lower layer portion 6 constitutes the lead-out wires 11a and 11c at both end sides of the coil and a lower layer portion of the coil main portion 11b. In the coil main portion 11b, Cu wires 6a extending in the width direction are aligned in the length direction. Regarding end portions of each of the Cu wires 6a, one end is bent to the tip side and the other end is bent to the root side. Outside the alignment of the Cu wires 6a in the width direction, the lead-out wire 11a at one end side and the lead-out wire 11c at the other end side are disposed in a manner to extend in the length direction.

Figure 5A:
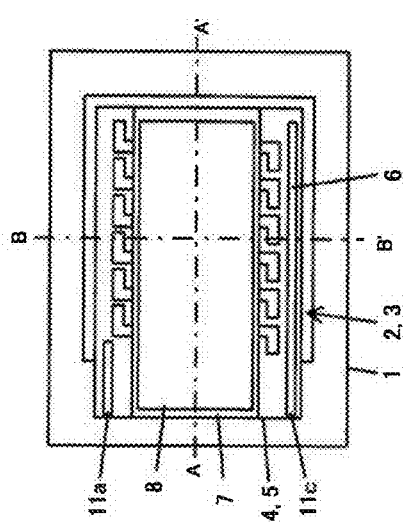
FIG. 5A is a schematic plan view illustrating a main manufacturing step of the vibration power generating device according to the first embodiment.
Figure 5B:
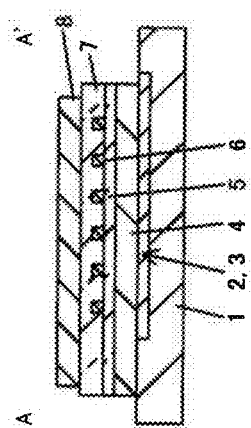
FIG. 5B is a cross-sectional view in the A-A' direction illustrated in FIG. 5A.
Figure 5C:
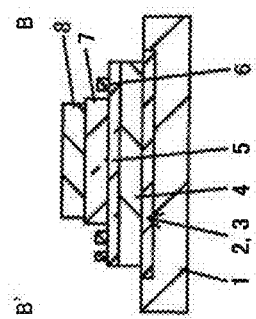
FIG. 5C is a cross-sectional view in the B-B' direction illustrated in FIG. 5A.

FIG. 5A, FIG. 5B, and FIG. 5C are seen as reference. An insulating layer 7 is formed on the insulating layer 5 in a manner to cover the alignment of the Cu wires 6a of the coil lower layer portion 6. The insulating layer 7 is formed in a manner that a silicon oxide layer deposited to have a thickness of 500 nm by sputtering is patterned by liftoff, for example. The insulating layer 7 is disposed so as to expose the both ends of the Cu wires 6a at the outside in the width direction.

On the insulating layer 7, a magnetostrictive layer 8 is formed. As a magnetostrictive material forming the magnetostrictive layer 8, it is possible to use, for example, Terfenol-D (brand name/to be abbreviated to "Terfenol," hereinafter) being a Tb—Dy—Fe based alloy having a composition of $Tb_{0.27}Dy_{0.73}Fe_{1.9}$.

The magnetostrictive layer 8 is formed in a manner that a Terfenol layer deposited to have a thickness of 1 μm by sputtering is patterned by liftoff, for example. The magnetostrictive layer 8 has a rectangular shape having a length in the A-A' direction of 27 mm and a width in the B-B' direction of 14 mm, for example.

Figure 6B:
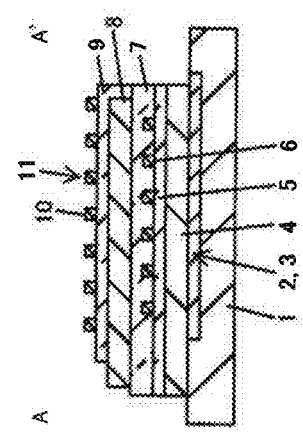
FIG. 6B is a cross-sectional view in the A-A' direction illustrated in FIG. 6A.
Figure 6C:
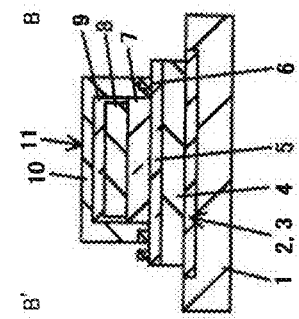
FIG. 6C is a cross-sectional view in the B-B' direction illustrated in FIG. 6A.

FIG. 6A, FIG. 6B, and FIG. 6C are seen as reference. An insulating layer 9 is formed on the insulating layer 7 in a manner to cover the magnetostrictive layer 8. The insulating layer 9 is formed in a manner that a silicon oxide layer deposited to have a thickness of 500 nm by sputtering is patterned by liftoff, for example. The insulating layer 9 is disposed so as to expose the top surface (and the side surfaces) of the magnetostrictive layer 8 at a root side end portion and covers the top surface and the side surfaces of the magnetostrictive layer 8 at portions other than the above.

Next, a resist pattern covering the outside of a formation region of a coil upper layer portion 10 is formed. On the whole surface, a Cu layer having a thickness of 1 μm is formed by sputtering, for example. By liftoff to remove an unnecessary portion of the Cu layer together with the resist pattern, the coil upper layer portion 10 is formed on the insulating layer 9. In the coil upper layer portion 10, Cu wires 10a extending in the width direction are aligned in the length direction alternately with the Cu wires 6a of the coil lower layer portion 6. Both end portions of each of the Cu wires 10a extend in the depth direction to form a U shape.

The Cu wires 10a of the coil upper layer portion 10 connect the end portions at one end side and the end portions at the other end side of the Cu wires 6a adjacent to one another in the coil lower layer portion 6, and thereby the coil main portion 11b surrounding the magnetostrictive layer 8 is formed. Further, the coil main portion 11b and the lead-out wire 11a at one end side are connected by the Cu wires 10a, and the coil main portion 11b and the lead-out wire 11c at the other end side are connected by the Cu wires 10a. In this manner, the coil 11 is formed by the coil lower layer portion 6 and the coil upper layer portion 10.

FIG. 7A, FIG. 7B, and FIG. 7C are seen as reference. An insulating layer 12 is formed in a manner to cover the coil 11. The insulating layer 12 is formed in a manner that a silicon oxide layer deposited to have a thickness of 500 nm by sputtering is patterned by liftoff, for example. The insulating layer 12 is disposed so as to expose the top surface (and the side surfaces) of the magnetostrictive layer 8 and the lead-out wires 11a and 11c of the coil 11 at the root side and portion.

The insulating layers 5, 7, 9, and 12 surround the magnetostrictive layer 8 (except for the root side end portion). The coil 11 is disposed to be buried in the insulating layers 5, 7, 9, and 12. The tough layer 4 formed of metallic glass, for example, is conductive. Between the tough layer 4 and the coil 11, the insulating layers 5 and 7 are interposed, and thereby an electrical short between the tough layer 4 and the coil 11 is suppressed.

Next, a resist pattern covering the magnetostrictive layer 8 and the lead-out wires 11a and 11c of the coil 11 is formed, and on the whole surface, and Ni seed layer having a thickness of 200 nm is formed by sputtering. Further, a resist pattern covering the outside of a formation region of a weight 13 is formed, and Ni is deposited to have a thickness of 100 μm by electrolytic plating to form the weight 13. The weight 13 is disposed on an end portion of the insulating layer 12 at the tip side. After the formation of the weight 13, all the resist patterns are removed. Incidentally, regarding the weight 13, a ferromagnetic film (a neodymium film) may also be formed by sputtering, pulsed laser deposition (PLD), or the like.

A resist pattern covering the magnetostrictive layer 8 and the lead-out wires 11a and 11c of the coil 11 is formed again, and the Ni seed layer remaining outside the weight 13 is removed by ion milling. Thereafter, the resist pattern is removed. In this manner, the oscillating member 14 in which up to the weight 13 is stacked above the tough layer 4 is formed.

Figures 8A, 8B, 8C:
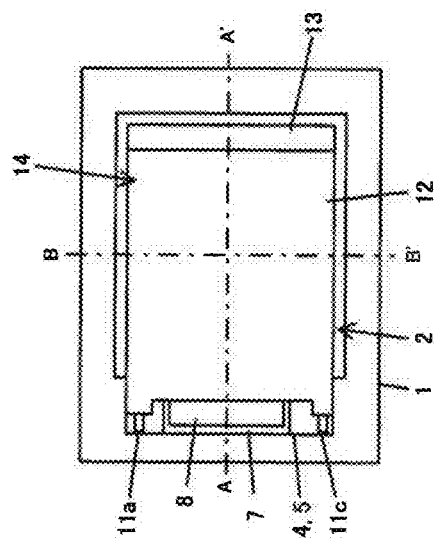
FIG. 8A is a schematic plan view illustrating a main manufacturing step of the vibration power generating device according to the first embodiment.
FIG. 8B is a cross-sectional view in the A-A' direction illustrated in FIG. 8A.
FIG. 8C is a cross-sectional view in the B-B' direction illustrated in FIG. 8A.

FIG. 8A, FIG. 8B, and FIG. 8C are seen as reference. A resist pattern covering the magnetostrictive layer 8 and the lead-out wires 11a and 11c of the coil 11 is formed again, and the silicon wafer 1 having had up to the weight 13 formed thereabove is immersed in a Cu etchant to remove (release) the copper layer 3. As a selective etchant of Cu, an ammonia-copper complex salt-based etchant, for example, can be used. The copper layer 3 is removed, and thereby the cantilever structure in which the oscillating member 14 supported by the silicon wafer 1 at the root side projects above the recessed portion 2 at the tip side is formed.

Figure 9A:
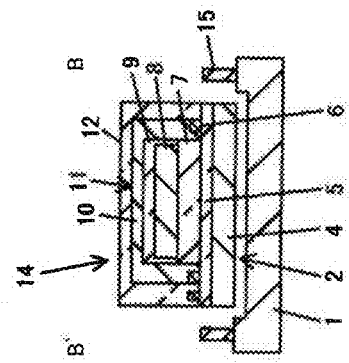
FIG. 9A is a schematic plan view illustrating a main manufacturing step of the vibration power generating device according to the first embodiment.
Figure 9B:
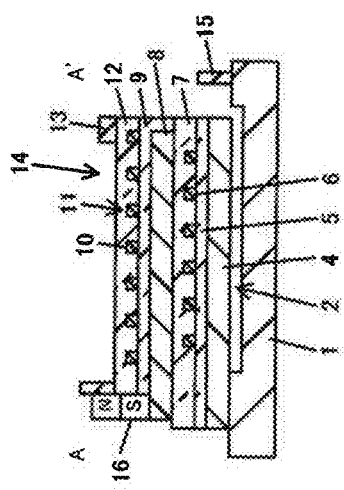
FIG. 9B is a cross-sectional view in the A-A' direction illustrated in FIG. 9A.
Figure 9C:
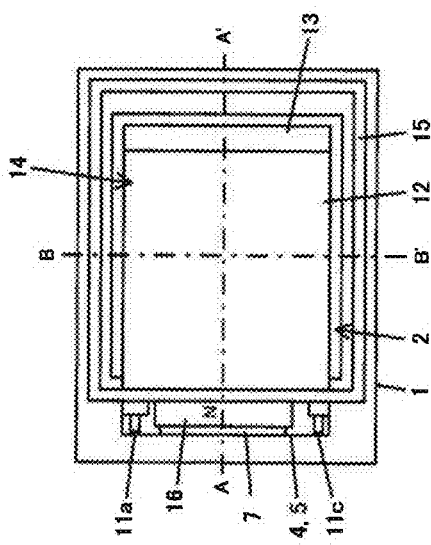
FIG. 9C is a cross-sectional view in the B-B' direction illustrated in FIG. 9A.

FIG. 9A, FIG. 9B, and FIG. 9C are seen as reference. At a connection portion of a cap 17 to be attached thereto in a step later, a sealing layer 15 made of AuSn is formed to have a thickness of 10 μm or so by printing or a dispenser. Incidentally, the sealing layer 15 made of AuSn can also be deposited by sputtering, and in this case, it is formed to have a thickness of 1 μm to 2 μm or so.

Further, on the exposed portion of the magnetostrictive layer 8 at the root side, a magnet 16 magnetized in the stack thickness direction is attached with an adhesive. The magnet 16 is a neodymium magnet with 490 mT, for example, and has a dimension in the oscillating member length direction (the A-A' direction) of 2 mm, a dimension in the oscillating member width direction (the B-B' direction) of 15 mm, and a dimension in the stack thickness direction of 10 mm.

Figure 10A:
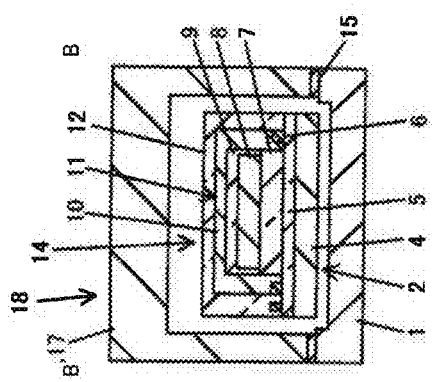
FIG. 10A is a schematic plan view illustrating a main manufacturing step of the vibration power generating device according to the first embodiment.
Figure 10B:
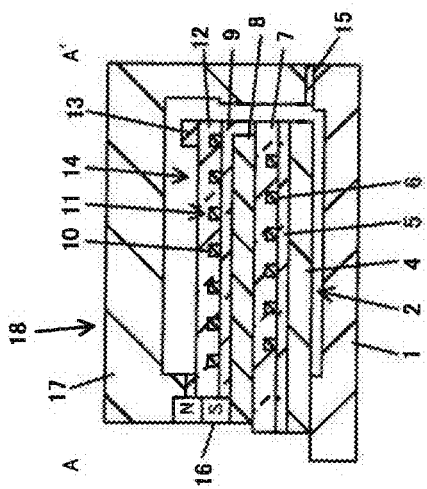
FIG. 10B is a cross-sectional view in the A-A' direction illustrated in FIG. 10A.
Figure 10C:
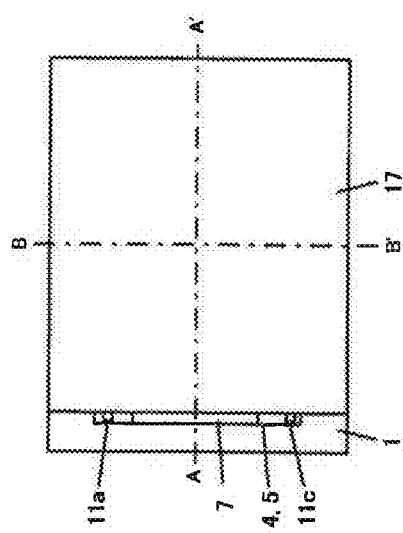
FIG. 10C is a cross-sectional view in the B-B' direction illustrated in FIG. 10A.

FIG. 10A, FIG. 10B, and FIG. 10C are seen as reference. The cap 17 obtained by forming a counterbore in a soft iron by machining is prepared separately. In a vacuum device, the cap 17 is positioned on the silicon wafer 1 where up to the sealing layer 15 and the magnet 16 are formed to be thermocompression bonded at 300° C. or so. In this manner, the oscillating member 14 is vacuum sealed. Regarding cap packaging, a wafer level package (WLP) to package all the chips of vibration power generating devices in a wafer state is desired.

The cap 17 forms a magnetic field applying member 18 to apply a magnetic field to the magnetostrictive layer 8 with the magnet 16 as well as being a package member. The cap 17 is connected to the magnet 16 at the root side, has an inner wall thereof at the tip side face the tip of the magnetostrictive layer 8, and becomes a yoke to apply a magnetic field to the magnetostrictive layer 8 in the length direction (the in-plane direction).

Incidentally, when a bias magnetic field is sufficiently applied to the magnetostrictive member 8 and a magnetic path is closed, tensile tension is strongly applied to the magnetostrictive member 8 too much, and in such a case, the cap 17 may also be formed of a nonmagnetic material such as copper or ceramics.

Thereafter, the vibration power generating devices being four chips formed simultaneously on the silicon wafer 1 are cut into each piece. In this manner, the vibration power generating device according to the first embodiment is formed.

Figure 11A:
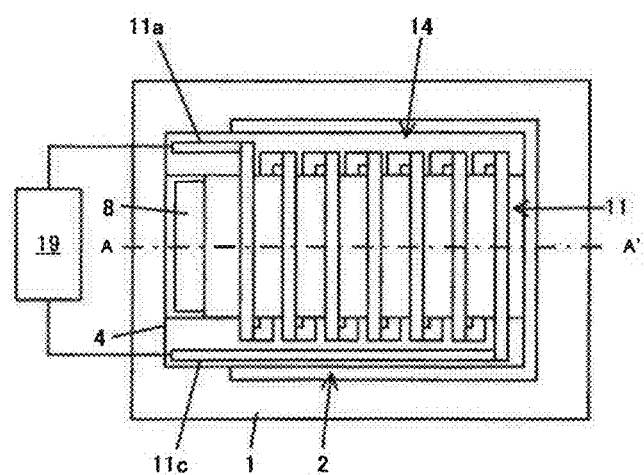
FIG. 11A is a plan view of a schematic structure of the vibration power generating device according to the first embodiment.
Figure 11B:
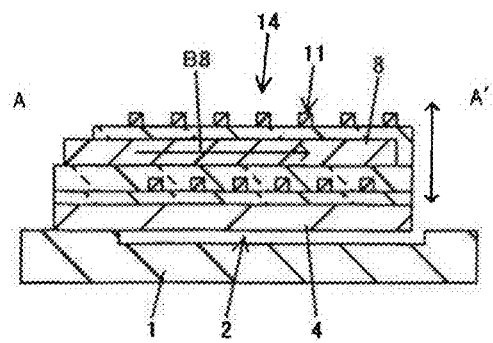
FIG. 11B is a cross-sectional view in the A-A' direction illustrated in FIG. 11A.

Next, the operation of the vibration power generating device according to the first embodiment is explained. FIG. 11A and FIG. 11B are a plan view and a cross-sectional view in the A-A' direction of a schematic structure of the vibration power generating device according to the first embodiment respectively. The supporting substrate (the silicon wafer) 1 of the vibration power generating device is attached to a vibratory source such as a machine and power generation is performed.

The oscillating member 14 has a cantilever structure supported by the silicon wafer 1 at the root side and the tip side of the oscillating member 14 can oscillate in the up and down direction (the stack thickness direction). The oscillating member 14 has a structure in which the magnetostrictive layer 8 is stacked above the tough layer 4, and the magnetostrictive layer 8 is formed of Terfenol, for example. Terfenol is large in brittleness, so that the oscillating member formed of only Terfenol itself breaks easily.

In this embodiment, the magnetostrictive layer 8 in a thin film shape is stacked above the tough layer 4 being a supporting layer formed of a material having large toughness such as metallic glass, thereby making it possible to improve toughness of the oscillating member 14 even when the magnetostrictive material large in brittleness is used for the magnetostrictive layer 8.

Further, the tough layer 4 is formed thinly, thereby making it possible to make the oscillating member 14 oscillate easily even with weak vibrations.

The structure in which the magnetostrictive layer 8 is stacked above the tough layer 4 is made, thereby making it possible to dispose a strain neutral surface where no strain is caused even when the oscillating member 14 is deflected in the stack thickness direction on the tough layer 4 side. This thereby makes it possible to selectively cause tensile strain in the magnetostrictive layer 8 when the oscillating member 14 is deformed downward and to selectively cause compressive strain in the magnetostrictive layer 8 when the oscillating member 14 is deformed upward.

The tough layer 4 is desirably formed thicker than the magnetostrictive layer 8 in order to dispose the strain neutral surface on the tough layer 4 side. Incidentally, when the oscillating member is formed of only the magnetostrictive member 8, the strain neutral surface is disposed in the magnetostrictive member 8, so that tensile strain and compressive strain are caused simultaneously in one side and its opposite side of the magnetostrictive member 8.

By the magnetic field applying member 18 (illustrated in FIG. 10B and the like), a magnetic field is applied to the magnetostrictive layer 8 in the length direction. With magnetostriction caused by the magnetic field application, a magnetic flux density B8 is generated in the magnetostrictive layer 8 in the length direction. When a positive magnetostrictive material (for example, Terfenol) is used, for example, magnetostriction extending in the direction of the applied magnetic field is caused by the magnetic field application. The applied magnetic field is set to a size such that the magnetic flux density B8 in the magnetostrictive layer 8 is not saturated.

A magnetostrictive material is subjected to deformation in a state where a magnetic field is applied thereto externally, and thereby a magnetic flux density to be generated in the magnetostrictive material changes (an inverse magnetostriction phenomenon or a Villari effect). The state where no strain exists in the magnetostrictive layer 8, or the state where the magnetostrictive layer does not oscillate is called a reference state.

When the magnetostrictive layer 8 is deformed downward to have tensile strain caused therein, namely when the magnetostrictive layer 8 is elongated, the magnetic flux density B8 in the magnetostrictive layer 8 becomes large as compared to that in the reference state. On the other hand, when the magnetostrictive layer 8 is deformed upward to have compressive strain caused therein, namely when the magnetostrictive layer 8 is shrunk, the magnetic flux density B8 in the magnetostrictive layer 8 becomes small as compared to that in the reference state.

Thus, due to oscillation, the magnetic flux density B8 in the magnetostrictive layer 8 increases and decreases periodically. In the coil 11 wound around the magnetostrictive layer 8, an induced current to prevent magnetic flux density changes caused by oscillation of the magnetostrictive layer 8 is generated. In this manner, power generation can be performed. A rectification and power storage circuit 19 is connected between the lead-out wires 11a and 11c at the both ends of the coil 11, where rectification of current of generated power and power storage are performed.

The vibration power generating device according to this embodiment is formed so that the oscillating member 14 can oscillate easily, and thus can be used also for power generation in a system with weak vibration acceleration. Incidentally, the vibration power generating device according to this embodiment can also be used as a vibration sensor.

As has been explained with reference to FIG. 10A, FIG. 10B, and FIG. 10C, the oscillating member 14 is vacuum sealed. Thereby, oscillation damping of the oscillating member 14 is more suppressed than in the atmosphere, so that it is possible to improve power generation efficiency. Incidentally, even when not the vacuum sealing but sealing under reduced pressure is employed, oscillation damping can be suppressed.

As described above, in this embodiment, the magnetostrictive layer 8 in a thin film shape is stacked above the tough layer 4 formed of a material having large toughness, and thereby toughness improvement of the oscillating member 14 is achieved. Further, the tough layer 4 is formed thinly, thereby making the oscillating member 4 oscillate easily.

There are explained a characteristic of a preferable material and a preferable thickness of the tough layer 4. Firstly, the material forming the tough layer 4 is desirably high in toughness from the perspective that the material is a thin film or thin sheet shape and has elasticity and does not easily cause fatigue failure against repeated vibrations.

Concretely, a material having a high fatigue strength (or tensile strength) with respect to a Young's modulus and having a large elastic limit is desirable. Generally, about ⅓ or so of tensile strength (stress when a material is pulled to break) is fatigue strength, and as the tensile strength is larger, the fatigue strength is large. The fatigue strength is a value that does not cause metal fatigue even when stress is applied repeatedly as long as the stress is the above stress or less, and regarding the material of the oscillating member 14, the fatigue strength is desirably high.

Regarding the tough material forming the tough layer 4, the tensile strength and the fatigue strength are desirably high as compared to those of the magnetostrictive material forming the magnetostrictive layer 8 because the tough layer 4 is a supporting layer for the magnetostrictive layer 8.

Secondly, the material forming the tough layer 4 is desirably a material having a small Young's modulus from the perspective that the material easily oscillates also by vibrations from a small vibratory source (small vibration acceleration) correspondingly.

FIG. 27 is a table where tensile strength (unit MPa), fatigue strength (unit MPa), Young's modulus (unit GPa), and elastic limit elongation (unit %) of general metals (iron, copper and so on), metallic glass, superelastic alloy, and single-crystal silicon are summarized.

Regarding the metallic glass and the superelastic alloy, the tensile strength and the fatigue strength are higher by about one digit, the Young's modulus is smaller, and the elastic limit elongation is larger than those of the general metals. Regarding the single-crystal silicon, the Young's modulus is equal to that of the general metals, but the tensile strength and the fatigue strength are higher by about two digits than those of the general metals.

From the above-described perspectives, it is possible to say that, for example, the metallic glass and the superelastic alloy (also a material called GUNMETAL (registered trademark)) each having a high tensile strength and a high fatigue strength, a small Young's modulus, and large elastic limit elongation as compared to the general metals are materials particularly preferable for the tough layer 4.

GUNMETAL (registered trademark) contains niobium, tantalum, vanadium, zirconium, hafnium, and oxygen and is a beta titanium alloy having a body-centered cubic structure. The composition of GUNMETAL (registered trademark) is expressed as $Ti_3(Nb, Ta, V)+(Zr, Hf)+O$ basically. GUNMETAL (registered trademark) is excellent in flexibility durability to thus be able to be used as a material of the tough layer 4 preferably. GUNMETAL (registered trademark) has been provided by Toyotsu Material Incorporated, for example.

Further, it is possible to say that the single-crystal silicon having a high tensile strength and a high fatigue strength as compared to the general metals and having a Young's modulus equal to that of the general metals is also a material preferable for the tough layer 4.

When the general metals are set as a reference, it is possible to say that the rough standard of high tensile strength is 1000 MPa order, for example, the rough standard of a low Young's modulus is 150 GPa or so or less, for example, and high elastic limit elongation is 0.5% or more. Regarding the material forming the tough layer 4, the tensile strength is desirably 1000 MPa or more, the Young's modulus is more desirably 150 GPa or less, and the elastic limit elongation is more desirably 0.5% or more.

In the above-described embodiment, the tough layer 4 is formed of PdCuSi-based metallic glass as one example, but as the metallic glass, for example, ZrCuTi-based metallic glass can also be used additionally. As the superelastic alloy, for example, a TiNi-based superelastic alloy can be used.

Incidentally, as a material other than the metallic glass, the superelastic alloy, and the single-crystal silicon, it is also possible to use a material that is brittle but hard, sensitive to vibrations, and does not fatigue such as ceramics (LTCC often used for electronic parts: low temperature co-fired ceramics or the like). Further, when dimensional precision is allowed to be somewhat sacrificed, there can also be used various polymeric materials such as a PET film having a high tensile strength, polyethylene carbide, polypropylene, polyimide, and polycarbonate.

The preferable thickness of the tough layer 4 is 1 µm to 5 µm or so in thin film formation in the case of the metallic glass and is 50 µm to 1000 µm or so in the case of using a ribbon shape, for example. Further, it is 1 µm to 5 µm or so in thin film formation in the case of the superelastic alloy and is 50 µm to 1000 µm or so in the case of using a ribbon shape, for example. Further, for example, it is 15 µm to 50 µm or so in the case of the single-crystal silicon, it is 20 µm to 1000 µm or so in the case of the ceramics, and it is 100 µm to 1000 µm or so in the case of the polymeric materials. When the various materials are summarized, the preferable thickness range of the tough layer 4 can be said to be 1 µm to 1000 µm or so on the whole.

The preferable thickness of the magnetostrictive layer 8 is explained. The magnetostrictive layer 8 is thinned, thereby making it possible to increase apparent toughness. Generally, when a material is made into a thin film even though the material is brittle, a curvature radius when the material being curved increases relatively with respect to the film thickness, so that apparent toughness increases.

The preferable film thickness of the magnetostrictive layer 8 in the case of a brittle magnetostrictive material such as Terfenol, for example, is 1 µm to 50 µm or so, for example. Further, when a magnetostrictive material having a certain degree of toughness such as, for example, a Fe—Ga alloy (Galfenol) is used, the film thickness is 1 µm to 1000 µm or so and is desirably thick to the extent that vibrations to be used can be picked up.

As above, according to this embodiment, the magnetostrictive layer 8 is stacked above the tough layer 4, so that it is possible to improve the toughness of the oscillating member 14 including the magnetostrictive layer 8. Therefore, according to this embodiment, it is possible to add large deformations to the magnetostrictive layer 8, uniformly cause strain in the whole magnetostrictive layer 8, and to improve the power generation efficiency. Further, according to this embodiment, the oscillating member 14 can be formed thinly, so that it is possible to correspond to low vibration frequencies and low vibration acceleration and to provide the power generating device having a significantly wide application range.

Second Embodiment

Next, there is explained a manufacturing method of a vibration power generating device according to a second embodiment. The second embodiment differs from the first embodiment in the coil structure. FIG. 12A to FIG. 19A are schematic plan views each illustrating a main manufacturing step of the vibration power generating device according to the second embodiment. FIG. 12B to FIG. 19B are schematic cross-sectional views taken along the dot and chain line in the A-A' direction (the length direction) of the plan views in FIG. 12A and the like, and FIG. 12C to FIG. 19C are schematic cross-sectional views taken along the dot and chain line in the B-B' direction (the width direction) of the plan views in FIG. 12A and the like.

Figure 12C:
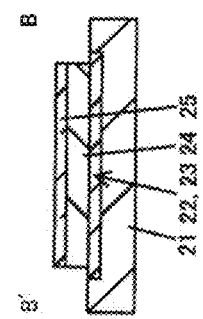
FIG. 12C is a cross-sectional view in the B-B' direction illustrated in FIG. 12A.
Figure 12B:
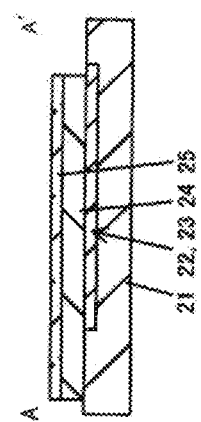
FIG. 12B is a cross-sectional view in the A-A' direction illustrated in FIG. 12A.
Figure 12A:
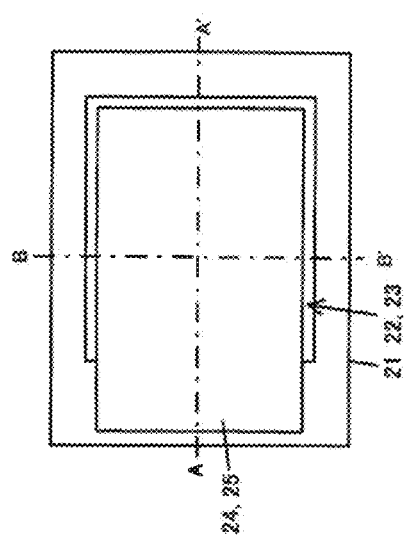
FIG. 12A is a schematic plan view illustrating a main manufacturing step of a vibration power generating device according to a second embodiment.

FIG. 12A, FIG. 12B, and FIG. 12C are seen as reference. First, in the same manner as that in up to the steps explained with reference to FIG. 1A to FIG. 1C and FIG. 2A to FIG. 2C of the first embodiment, a recessed portion 22 is formed in a silicon wafer (supporting substrate) 21 and a copper layer 23 is filled in the recessed portion 22. Then, in the same manner as that in the steps explained with reference to FIG. 3A to FIG. 3C of the first embodiment, a tough layer 24 and an insulating layer 25 are formed.

Figure 13C:
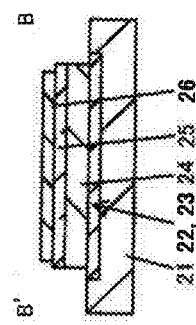
FIG. 13C is a cross-sectional view in the B-B' direction illustrated in FIG. 13A.
Figure 13B:
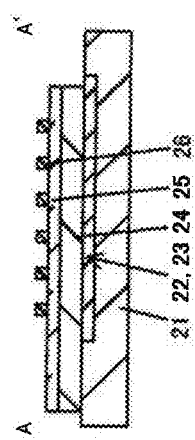
FIG. 13B is a cross-sectional view in the A-A' direction illustrated in FIG. 13A.
Figure 13A:
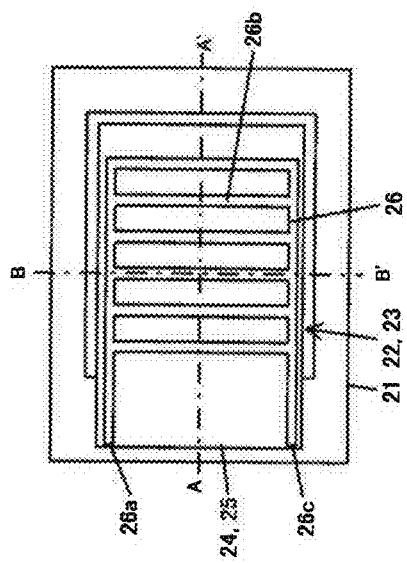
FIG. 13A is a schematic plan view illustrating a main manufacturing step of the vibration power generating device according to the second embodiment.

FIG. 13A, FIG. 13B, and FIG. 13C are seen as reference. On the insulating layer 25, a resist pattern covering the outside of a formation region of a lower plane ladder coil 26 is formed. On the whole surface, a Cu layer having a thickness of 1 µm is formed by sputtering, for example. By liftoff to remove an unnecessary portion of the Cu layer together with the resist pattern, the lower plane ladder coil 26 is formed on the insulating layer 25.

The lower plane ladder coil 26 has a ladder-shaped structure in which between two Cu wires 26*a* and 26*c* extending in the length direction, plural Cu wires 26*b* extending in the width direction and connecting the Cu wire 26*a* and the Cu wire 26*c* are disposed in parallel to one another. The Cu wires 26*a* and 26*c* also double as a lead-out wire.

Figure 14A:
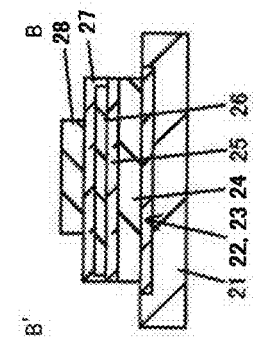
FIG. 14A is a schematic plan view illustrating a main manufacturing step of the vibration power generating device according to the second embodiment.
Figure 14B:
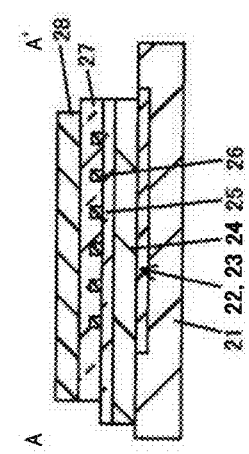
FIG. 14B is a cross-sectional view in the A-A' direction illustrated in FIG. 14A.
Figure 14C:
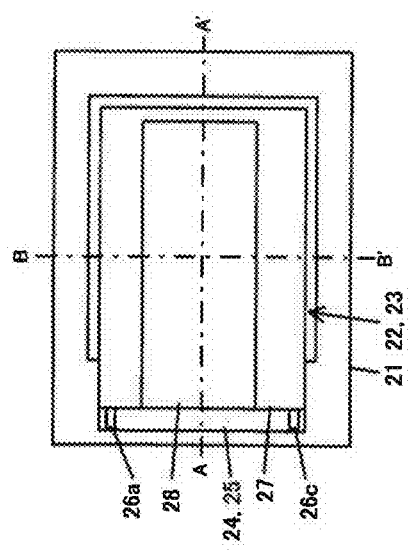
FIG. 14C is a cross-sectional view in the B-B' direction illustrated in FIG. 14A.

FIG. 14A, FIG. 14B, and FIG. 14C are seen as reference. An insulating layer 27 is formed on the insulating layer 25 in a manner to cover the lower plane ladder coil 26. The insulating layer 27 is formed in a manner that a silicon oxide layer deposited to have a thickness of 500 nm by sputtering is patterned by liftoff, for example. The insulating layer 27 is disposed so as to expose the lead-out wires 26*a* and 26*c* of the lower plane ladder coil 26 at a root side end portion.

On the insulating layer 27, a magnetostrictive layer 28 is formed. As a magnetostrictive material forming the magnetostrictive layer 28, for example, Terfenol can be used. The magnetostrictive layer 28 is formed in a manner that a Terfenol layer deposited to have a thickness of 1 μm by sputtering is patterned by liftoff, for example.

Figure 15A:
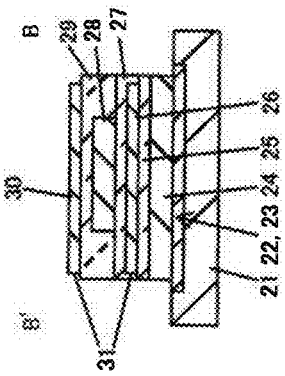
FIG. 15A is a schematic plan view illustrating a main manufacturing step of the vibration power generating device according to the second embodiment.
Figure 15B:
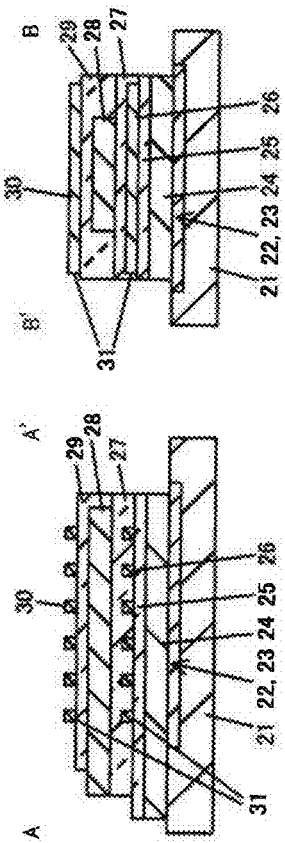
FIG. 15B is a cross-sectional view in the A-A' direction illustrated in FIG. 15A.
Figure 15C:
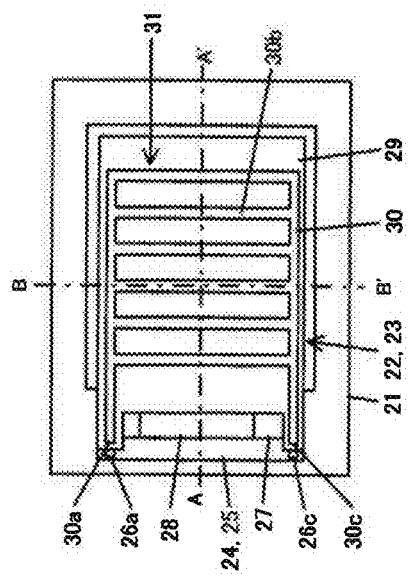
FIG. 15C is a cross-sectional view in the B-B' direction illustrated in FIG. 15A.

FIG. 15A, FIG. 15B, and FIG. 15C are seen as reference. An insulating layer 29 is formed in a manner to cover the magnetostrictive layer 28. The insulating layer 29 is formed in a manner that a silicon oxide layer deposited to have a thickness of 500 nm by sputtering is patterned by liftoff, for example. The insulating layer 29 is disposed so as to expose the top surface (and the side surfaces) of the magnetostrictive layer 28 at the root side end portion, and covers the top surface and the side surfaces of the magnetostrictive layer 28 at portions other than the above.

Next, a resist pattern covering the outside of a formation region of an upper plane ladder coil 30 is formed. On the whole surface, a Cu layer having a thickness of 1 μm is formed by sputtering, for example. By liftoff to remove an unnecessary portion of the Cu layer together with the resist pattern, the upper plane ladder coil 30 is formed on the insulating layer 29.

Similarly to the lower plane ladder coil 26, the upper plane ladder coil 30 has a ladder-shaped structure in which between two Cu wires 30a and 30c extending in the length direction, plural Cu wires 30b extending in the width direction and connecting the Cu wire 30a and the Cu wire 30c are disposed in parallel to one another. The Cu wires 30a and 30c also double as a lead-out wire. The paired plane ladder coils 26 and 30 disposed above and below the magnetostrictive layer 28 form a coil structure (a coil) 31 in the second embodiment.

FIG. 16A, FIG. 16B, and FIG. 16C are seen as reference. An insulating layer 32 is formed in a manner to cover the upper plane ladder coil 30. The insulating layer 32 is formed in a manner that a silicon oxide layer deposited to have a thickness of 500 nm by sputtering is patterned by liftoff, for example. The insulating layer 32 is disposed so as to expose the top surface (and the side surfaces) of the magnetostrictive layer 28 and the lead-out wires 26a, 26c, 30a, and 30c of the coil structure 31 at the root side end portion.

Next, a resist pattern covering the magnetostrictive layer 28 and the lead-out wires 26a, 26c, 30a, and 30c of the coil structure 31 is formed, and on the whole surface, an Ni seed layer having a thickness of 200 nm is formed by sputtering. Further, a resist pattern covering the outside of a formation region of a weight 33 is formed, and Ni is deposited to have a thickness of 100 μm by electrolytic plating to form the weigh 33. The weight 33 is disposed on an end portion of the insulating layer 32 at the tip side. After the formation of the weight 33, all the resist patterns are removed. Incidentally, regarding the weight 33, a ferromagnetic film (a neodymium film) may also be formed by sputtering, pulsed laser deposition (PLD), or the like.

A resist pattern covering the magnetostrictive layer 28 and the lead-out wires 26a, 26c, 30a, and 30c of the coil structure 31 is formed again, and the Ni seed layer remaining outside the weight 33 is removed by ion milling. Thereafter, the resist pattern is removed. In this manner, an oscillating member 34 in which up to the weight 33 is stacked above the tough layer 24 is formed.

FIG. 17A, FIG. 17B, and FIG. 17C are seen as reference. A resist pattern covering the magnetostrictive layer 28 and the lead-out wires 26a, 26c, 30a, and 30c of the coil structure 31 is formed again, and the silicon wafer 21 having had up to the weight 33 formed thereabove is immersed in a Cu etchant to remove (release) the copper layer 23. The copper layer 23 is removed, and thereby a cantilever structure in which the oscillating member 34 supported by the silicon wafer 21 at the root side projects above the recessed portion 22 at the tip side is formed.

FIG. 18A, FIG. 18, and FIG. 18C are seen as reference. In the same manner as that in the steps explained with reference to FIG. 9A to FIG. 9C of the first embodiment, a sealing layer 35 is formed, and on the exposed portion of the magnetostrictive layer 28 at the root side, a magnet 36 is attached.

FIG. 19A, FIG. 19B, and FIG. 19C are seen as reference. In the same manner as that in the steps explained with reference to FIG. 10A to FIG. 10C of the first embodiment, when a magnetic flux is desired to be closed almost completely, a cap 37 doubling as a yoke is attached to vacuum seal the oscillating member 34 and to form a magnetic field applying member 38.

Incidentally, when a bias magnetic field is sufficiently applied to the magnetostrictive member 28, the cap 37 is not necessarily a ferromagnetic material having a yoke function, and may also be formed of a nonmagnetic material such as plastic, aluminum, or cooper.

Thereafter, the vibration power generating devices formed simultaneously on the silicon wafer 21 are cut into each piece. In this manner, the vibration power generating device according to the second embodiment is formed.

Figure 20A:
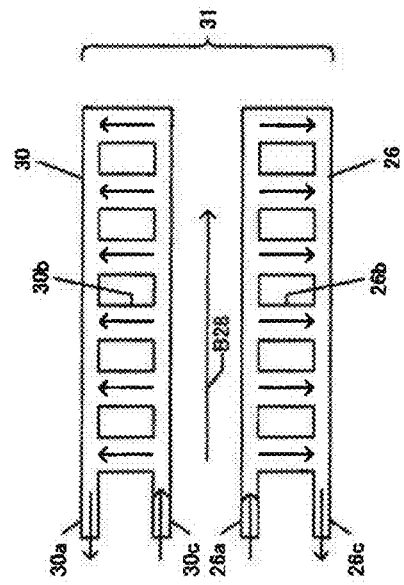
FIG. 20A is a plan view of a schematic structure of the vibration power generating device according to the second embodiment.
Figure 20D:
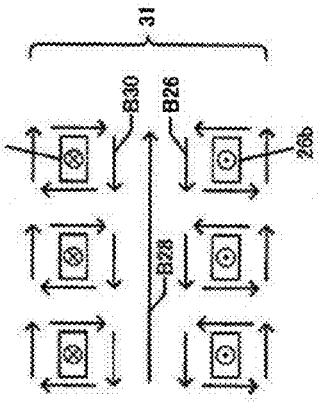
FIG. 20D is a cross-sectional view in the A-A' direction of a coil structure in the second embodiment.
Figure 20B:
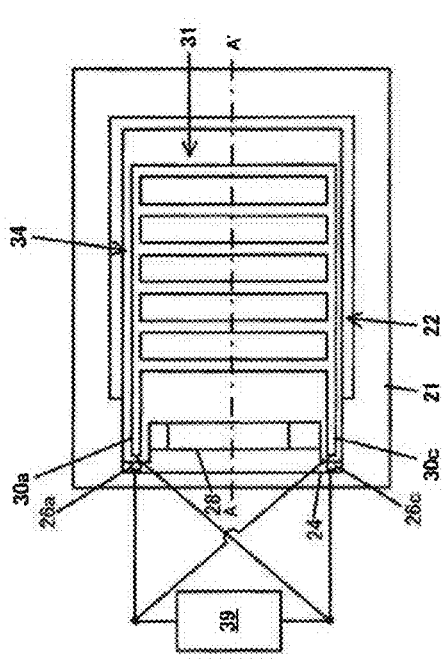
FIG. 20B is a cross-sectional view in the A-A' direction of a schematic structure of the vibration power generating device according to the second embodiment.
Figure 20C:
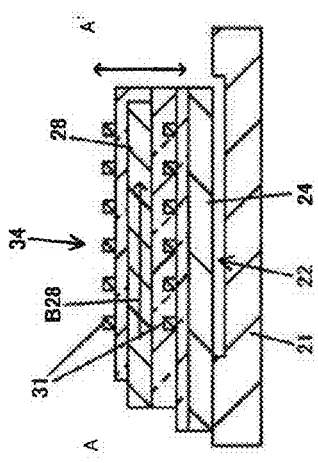
FIG. 20C is a schematic plan view of a coil structure in the second embodiment.

Next, the operation of the vibration power generating device, according to the second embodiment is explained. FIG. 20A and FIG. 20B are a plan view and a cross-sectional view in the A-A' direction of a schematic structure of the vibration power generating device according to the second embodiment respectively. FIG. 20C and FIG. 20D are a schematic plan view and a cross-sectional view in the A-A' direction of the coil structure 31 in the second embodiment respectively.

The fact that the magnetostrictive layer 28 in a thin film shape is stacked above the tough layer 24 formed of a material having large toughness, thereby improving the toughness of the oscillating member 34 and a strain neutral surface is disposed on the tough layer 24 side and tensile strain or compressive strain is selectively caused in the magnetostrictive layer 28 is the same as that in the first embodiment. Further, the fact that with oscillation of the oscillating member 34, a magnetic flux density B28 generated in the magnetostrictive layer 28 in the length direction increases and decreases periodically is the same as that in the first embodiment.

FIG. 20C is a schematic plan view illustrating the lower plane ladder coil 26 and the upper plane ladder coil 30 laid side by side, and illustrates the directions of currents generated in the respective plane ladder coils when the magnetic flux density B28 in the magnetostrictive layer 28 increases (the magnetostrictive layer 28 is deflective downward).

FIG. 20D is a cross-sectional view in the A-A' direction of the lower plane ladder coil 26 and the upper plane ladder coil 30, and illustrates the directions of currents generated in the respective plane ladder coils and the directions of magnetic fluxes generated by the currents when the magnetic flux density B28 in the magnetostrictive layer 28 increases (the magnetostrictive layer 28 is deflected downward). The direction of the magnetic flux density B28 in the magnetostrictive layer 28 is directed to the tip side from the root side, for example.

As illustrated in FIG. 20D, when the magnetic flux density B28 in the magnetostrictive layer 28 increases, a current is generated in each of the lower plane ladder coil 26 and the upper plane ladder coil 30 so as to generate a magnetic flux to prevent this.

In the lower plane ladder coil 26, a current directed from the rear side of the paper to the front side is generated in the Cu wires 26b so as to generate a magnetic flux B26 directed from the tip side to the root side on the upper side (the magnetostrictive layer 28 side).

On the other hand, in the upper plane ladder coil 30, a current directed from the front side of the paper to the rear side is generated in the Cu wires 30b so as to generate a magnetic flux B30 directed from the tip side to the root side on the lower side (the magnetostrictive layer 28 side).

As illustrated in FIG. 20C, the direction of the current to flow through the Cu wires 26b of the lower plane ladder coil 26 and the direction of the current to flow through the Cu wires 30b of the upper plane ladder coil 30 are opposite to each other, so that the lead-out wire 26a of the lower plane ladder coil 26 at one and side and the lead-out wire 30c of the upper plane ladder coil 30 at the other end side become homopolar and the lead-out wire 26c of the lower plane ladder coil 26 at the other end side and the lead-out wire 30a of the upper plane ladder coil 30 at one end side become homopolar.

Thus, as illustrated in FIG. 20A, a cross wiring structure is formed so that the lead-out wires 26a and 30c with one polarity can be connected and the lead-out wires 26c and 30a with the other polarity can be connected. A rectification and power storage circuit 39 is connected between the lead-out wires 26a and 30c and the lead-out wires 26c and 30a of the coil structure 31, where rectification of current of generated power and power storage are performed.

Regarding the coil 11 in the first embodiment, the coil lower layer portion 6 and the coil upper layer portion 10 are connected in the stacking step to form an integrated coil. Regarding the coil structure 31 in the second embodiment, the lower plane ladder coil 26 and the upper plane ladder coil 30 each function as an independent coil, so that the lower plane ladder coil 26 and the upper plane ladder coil 30 do not have to be connected, resulting in that the manufacturing step is more facilitated.

Incidentally, in the second embodiment, the upper plane ladder coil 30 and the lower plane ladder coil 26 are formed above and below the magnetostrictive layer 28, but as long as at least one of the plane ladder coils is formed, power generation can be performed. The plane ladder coil is formed above and below the magnetostrictive layer 28, thereby making it possible to improve the power generation efficiency.

Incidentally, the manufacturing steps of the vibration power generating device according to the above-described first embodiment and second embodiment are illustrated as an example, and it is also possible to add an adhesiveness improving layer, a metal diffusion preventing layer, and an orientation film of aligning orientations of a magnetostrictive layer and to add a heat treatment step.

Incidentally, as will be explained as a third embodiment hereinafter, it is also possible to apply a step in which a tough substrate is used as the tough layer, and plural oscillating members in which a magnetostrictive layer is formed above the tough substrate and a coil is formed around the magnetostrictive layer are formed simultaneously to then be cut into each piece, and each vibration power generating device is assembled. As the tough substrate, for example, a metallic glass thin sheet, a GUN-METAL (registered trademark) thin sheet, a single-crystal silicon thin sheet, a ceramics thin sheet, a polymeric material thin sheet, or the like can be used.

Third Embodiment

FIG. 21A to FIG. 24A are schematic plan views each illustrating a main manufacturing step of a vibration power generating device according to the third embodiment. FIG. 21B to FIG. 24B are schematic cross-sectional views taken along the dot and chain line in the A-A' direction (the length direction) of the plan views in FIG. 21A and the like, and FIG. 21C to FIG. 24C are schematic cross-sectional views taken along the dot and chain line in the B-B' direction (the width direction) of the plan views in FIG. 21A and the like.

Figures 21A, 21B, 21C:
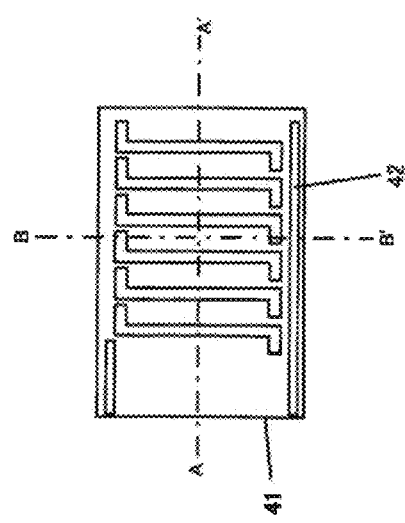
FIG. 21A is a schematic plan view illustrating a main manufacturing step of a vibration power generating device according to a third embodiment.
FIG. 21B is a cross-sectional view in the A-A' direction illustrated in FIG. 21A.
FIG. 21C is a cross-sectional view in the B-B' direction illustrated in FIG. 21A.

FIG. 21A, FIG. 21B, and FIG. 21C are seen as reference. As a tough substrate (tough layer) 41, for example, a polyimide thin sheet having a thickness of 500 μm is used. In the same manner as that in the step of forming the coil lower layer portion 6 in the first embodiment (see FIG. 4A to FIG. 4C), a coil lower layer portion 42 made of Cu is formed on the tough substrate 41.

Figure 22C:
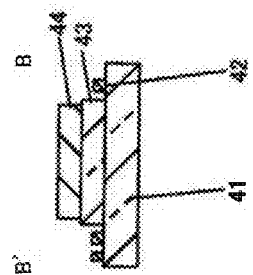
FIG. 22C is a cross-sectional view in the B-B' direction illustrated in FIG. 22A.
Figure 22B:
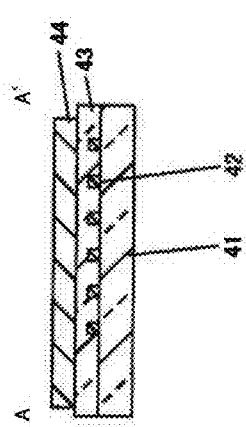
FIG. 22B is a cross-sectional view in the A-A' direction illustrated in FIG. 22A.
Figure 22A:
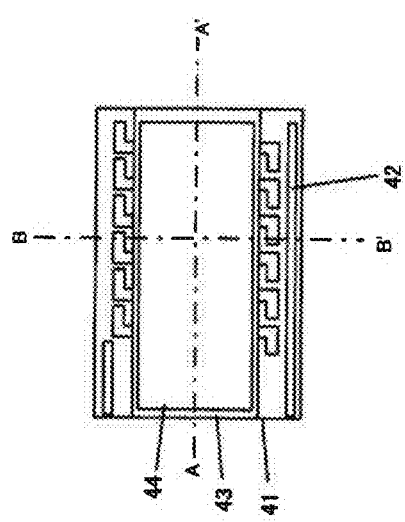
FIG. 22A is a schematic plan illustrating a main manufacturing step of the vibration power generating device according to the third embodiment.

FIG. 22A, FIG. 22B, and FIG. 22C are seen as reference. In the same manner as that in the step of forming the insulating layer 7 in the first embodiment (see FIG. 5A to FIG. 5C), an insulating layer 43 is formed on the tough substrate 41 in a manner to cover part of the coil lower layer portion 42.

Further, on the insulating layer 43, a magnetostrictive layer 44 is formed. The magnetostrictive layer 44 can be formed in a manner that, for example, a Fe—Ga magnetostrictive ribbon material (having a thickness of 300 μm, for example) by a liquid quenching and solidifying method is bonded on the insulating layer 43. Incidentally, the magnetostrictive layer 44 can also be formed by sputtering, for example, similarly to the first embodiment.

Figure 23A:
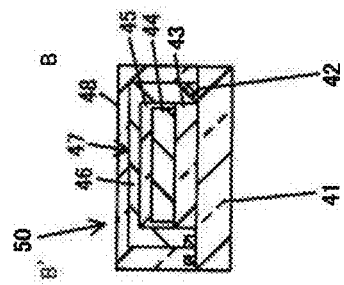
FIG. 23A is a schematic plan view illustrating a main manufacturing step of the vibration power generating device according to the third embodiment.
Figure 23B:
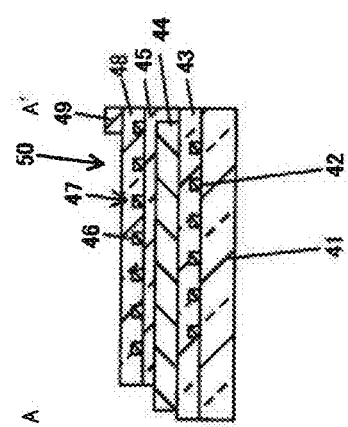
FIG. 23B is a cross-sectional view in the A-A' direction illustrated in FIG. 23A.
Figure 23C:
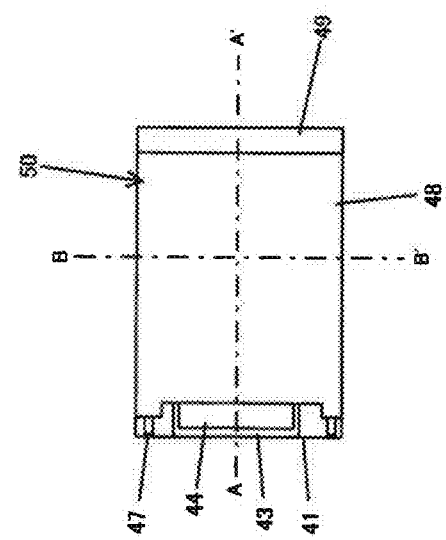
FIG. 23C is a cross-sectional view in the B-B' direction illustrated in FIG. 23A.

FIG. 23A, FIG. 23B, and FIG. 23C are seen as reference. After the formation of the magnetostrictive layer 44, in the same manner as that in the steps of forming the insulating layer 9, the coil upper layer portion 10 (the coil 11), the insulating layer 12, and the weight 13 to form the oscillating member 14 in the first embodiment, an insulating layer 45, a coil upper layer portion 46 (a coil 47), an insulating layer 48, and a weight 49 are formed to form an oscillating member 50. Incidentally, the weight 49 may also be a magnet. The forming method on that occasion may be either a method of fixing a permanent magnet with an adhesive or a method of forming a thin film magnet. When a magnet is used as the weight 49, as a material of a cap 55 to be described later, a nonmagnetic material is preferably used.

The plural oscillating members 50 are formed on the tough substrate 41 simultaneously, and then the tough substrate 41 is cut to separate the oscillating members 50 into each piece.

Figure 24A:
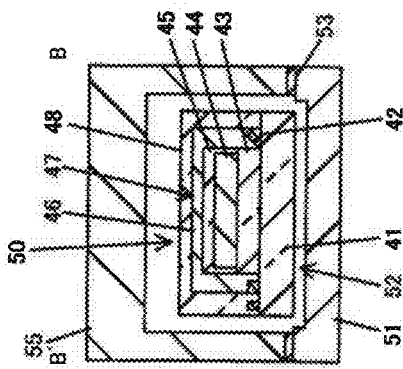
FIG. 24A is a schematic plan view illustrating a main manufacturing step of the vibration power generating device according to the third embodiment.
Figure 24B:
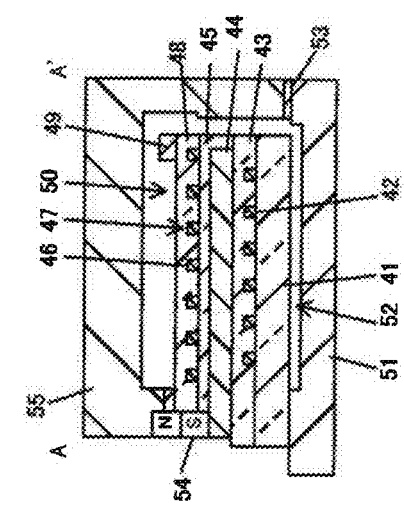
FIG. 24B is a cross-sectional view in the A-A' direction illustrated in FIG. 24A.
Figure 24C:
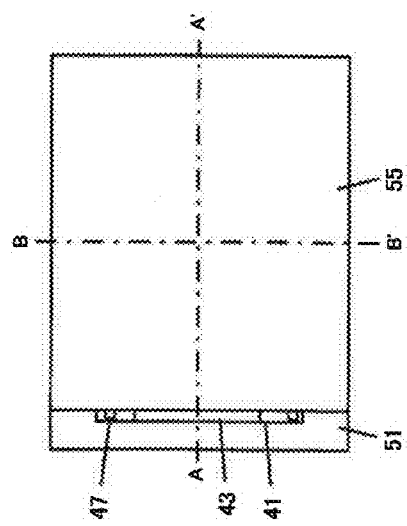
FIG. 24C is a cross-sectional view in the B-B' direction illustrated in FIG. 24A.

FIG. 24A, FIG. 24B, and FIG. 24C are seen as reference. Thereafter, on the oscillating member 50, a magnet 54 is attached, the oscillating member 50 is bonded to a supporting substrate (a counterbore substrate) 51 having a recessed portion 52 formed therein, and the cap 55 is attached by using a sealing member 53. In this manner, the oscillating member 50 is sandwiched between the counterbore substrate 51 and the cap 55 to be packaged, and thereby the vibration power generating device according to the third embodiment is formed.

Incidentally, in the above-described first embodiment to third embodiment, the coil is formed integrally in the oscillating member including the tough layer and the magnetostrictive layer, but the coil is not necessarily formed in the oscillating member. It is also possible to form a structure in which a line coil to wind around the magnetostrictive layer is disposed separately from the oscillating member including the tough layer and one magnetostrictive layer, for example. Hereinafter, as a fourth embodiment, there is explained a structure in which a coil is wound around a package.

Fourth Embodiment

Figure 25A:
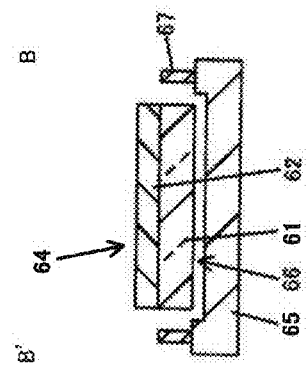
FIG. 25A is a schematic plan view illustrating a main manufacturing step of a vibration power generating device according to a fourth embodiment.
Figure 25B:
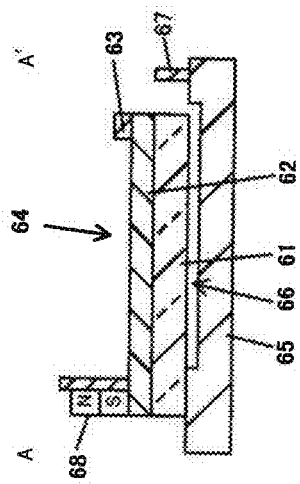
FIG. 25B is a cross-sectional view in the A-A' direction illustrated in FIG. 25A.

FIG. 25A and FIG. 26A are schematic plan views each illustrating a main manufacturing step of a vibration power generating device according to the fourth embodiment. FIG. 25B and FIG. 26B are schematic cross-sectional views taken along the dot and chain line in the A-A' direction (the length direction) of the plan views in FIG. 25A and the like, and FIG. 25C and FIG. 26C are schematic cross-sectional views taken along the dot and chain line in the B-B' direction (the width direction) of the plan views in FIG. 25A and the like.

Figure 25C:
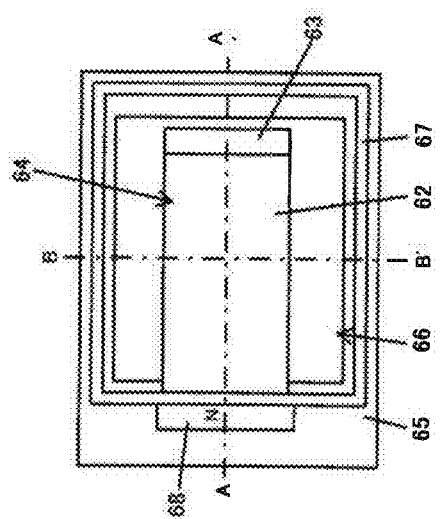
FIG. 25C is a cross-sectional view in the B-B' direction illustrated in FIG. 25A.

FIG. 25A, FIG. 25B, and FIG. 25C are seen as reference. On a tough layer 61, a magnetostrictive layer 62 is formed and a weight 63 is formed, and thereby an oscillating member 64 is formed. Incidentally, the weight 63 may also be a magnet. The forming method on that occasion may be either a method of fixing a permanent magnet with an adhesive or a method of forming a thin film magnet.

The oscillating member 64 is bonded to a supporting substrate (a counterbore substrate) 65 having a recessed portion 66 therein. The counterbore substrate 65 in the fourth embodiment is desirably formed of a nonmagnetic material such as copper, aluminum, ceramics, or plastic, for example. A magnet 68 is attached and a sealing member 67 is formed.

FIG. 26A, FIG. 26B, and FIG. 26C are seen as reference. The oscillating member 64 is sandwiched between the counterbore substrate 65 and a cap 69 to be packaged. The cap 69 in the fourth embodiment is desirably formed of a nonmagnetic material such as copper, aluminum, ceramics, or plastic, for example.

After the cap 69 is attached, an induction coil (a coil) 70 is mechanically wound around the whole package. In this manner, the vibration power generating device according to the fourth embodiment is formed.

Evaluation Result

Next, there are explained evaluation results by using FIG. 28A and FIG. 28B to FIG. 32.

Figure 28A:
FIG. 28A and FIG. 28B are schematic views each illustrating a vibration power generating device according to Example 1.
Figure 28B:
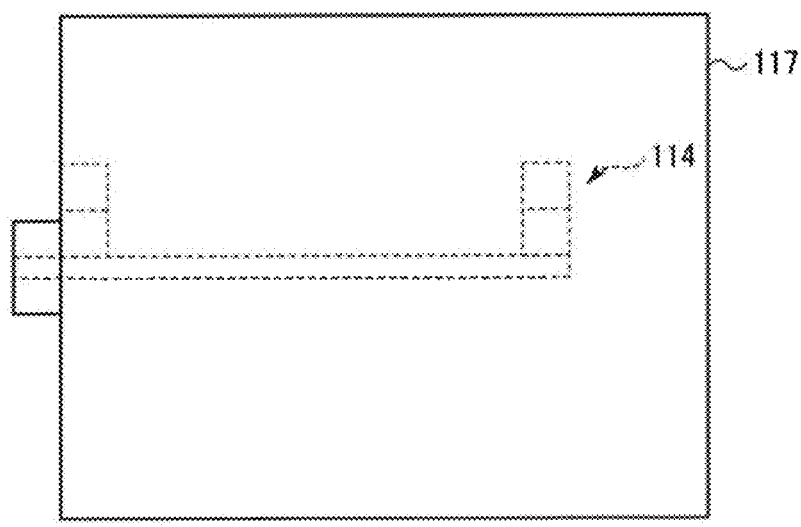
Figure 29:
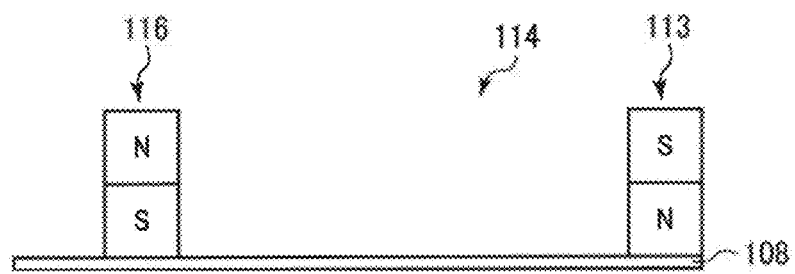
FIG. 29 is a side view illustrating part of the vibration power generating device according to Example 1.
Figure 30A:
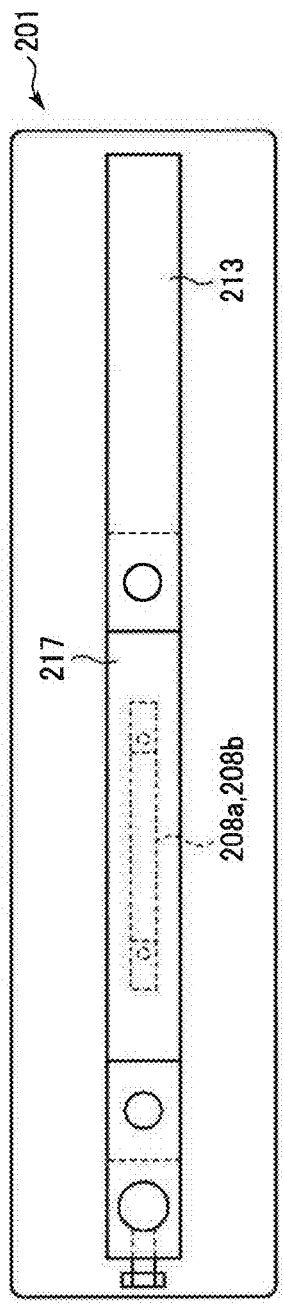
FIG. 30A and FIG. 30B are schematic views each illustrating a vibration power generating device according to Comparative example 1.
Figure 30B:
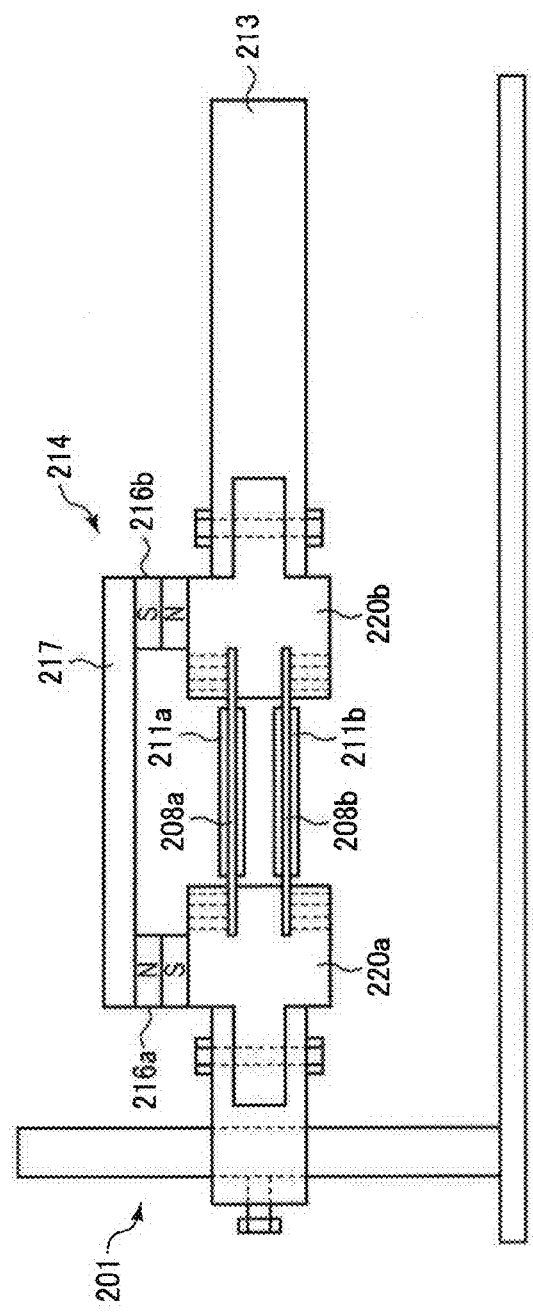

FIGS. 28A and 28B are schematic views each illustrating a vibration power generating device according to Example 1. FIG. 28A is a plan view and FIG. 28B is a side view. FIG. 29 is a side view illustrating part of the vibration power generating device according to Example 1. FIG. 30A and FIG. 30B are schematic views each illustrating a vibration power generating device according to Comparative example 1. FIG. 30A is a plan view and FIG. 30B is a side view. FIG. 31A and FIG. 31B are a plan view and a side view each illustrating a vibration power generating device according to Comparative example 2. FIG. 31A is a plan view and FIG. 31B is a side view.

Example 1 is one corresponding to the vibration power generating devices according to the above-described first to fourth embodiments. In Example 1, as a tough layer 104, a polycarbonate sheet having a thickness of 500 μm is used. The tough layer 104 is one corresponding to the tough layers 4, 24, 41, and 61 in the above-described embodiments. As a magnetostrictive layer 108, a Fe—Ga ribbon material having a thickness of 200 μm is used. The magnetostrictive layer 108 is one corresponding to the magnetostrictive layers 8, 28, 44, and 62 in the above-described embodiments. The volume of the magnetostrictive layer 108 is set no 0.044 cm$^3$. To the root side of an oscillating member 114 including the tough layer 104 and the magnetostrictive layer 108, a magnet 116 is attached. The oscillating member 114 is one corresponding to the oscillating members 14, 34, 50, and 64 in the above-described embodiments. To the tip side of the oscillating member 114, a magnet 113 doubling as a weight is attached. The weight 113 is one corresponding to the weights 13, 33, 49, and 63 in the above-described embodiments. The distance between the magnet 116 at the root side and the magnet 113 at the tip side is set to 55 mm. The mass of the magnet 113 doubling as the weight is set to 3 g. Then, the root side of the oscillating member 114 is fixed to a casing 117. The casing 117 is one corresponding to the supporting substrates 1, 21, 51, and 65 and the caps 17, 37, 55, and 69 in the above-described embodiments. The size of the casing 117 is set to 55 mm×70 mm×20 mm. The volumetric capacity of the casing 117 is set to 77 cm$^3$. A coil (not illustrated) is wound around the casing 117. Such a coil is one corresponding to the coils 11, 31, 47, and 70 in the above-described embodiments.

In Comparative example 1, two magnetostrictive materials 208a and 208b are disposed to be parallel to each other. As each of the magnetostrictive materials 208a and 208b, a Fe—Ga magnetostrictive sheet is used. Coils 211a and 211b are wound around the magnetostrictive sheets 208a and 208b respectively. The volume of each of the magnetostrictive sheets 208a and 208b is set to 1.2 cm$^3$. The two magnetostrictive sheets 208a and 208b disposed to be parallel to each other are coupled to coupling yokes 220a and 220b provided at the root side and the tip side. To the tip side of an oscillating member 214 including the magnetostrictive sheets 208a and 208b, a weight 213 is attached. The mass of the weight 213 is set to 354 g. Further, magnets 216a and 216b are attached to the root side and the tip side of the oscillating member 214 respectively. Then, a back yoke 217 is attached so that the magnet 216a and the magnet 216b may be coupled magnetically. Then, the root side of the oscillating member 214 is fixed to a support 201.

In Comparative example 2 as well, two magnetostrictive materials 308a and 308b are disposed to be parallel to each other. As each of the magnetostrictive materials 308a and 308b, a Fe—Ga magnetostrictive sheet is used. Coils 311a and 311b are wound around the magnetostrictive sheets 308a and 308b respectively. The volume of each of the magnetostrictive sheets 308a and 308b is set to 1.2 cm$^3$. The two magnetostrictive sheets 308a and 308b disposed to be parallel to each other are coupled to a coupling yoke 320a provided at the root side and a coupling yoke 320b provided at the tip side. The coupling yoke 320b provided at the tip side of an oscillating member 314 including the magnetostrictive sheets 308a and 308b is one doubling as a weight. The mass of the weight 320b is set to 35 g. Further, magnets 316a and 316b are attached to the root side and the tip side of the oscillating member 314 respectively. Then, a back yoke 317 is attached so that the magnet 316a and the magnet 316b may be coupled magnetically. Then, the root side of the oscillating member 314 is fixed to a support 301.

FIG. 32 is a graph illustrating the relationship between acceleration of vibration and output per unit amount. The horizontal axis in FIG. 32 indicates the acceleration. The vertical axis in FIG. 32 indicates the output per unit amount. The output per unit amount is obtained by dividing a value of output obtained actually by a product of the volume of a magnetostrictive material and the mass of a weight.

The plot of ● mark in FIG. 32 indicates the case of Example 1. The plot of ♦ mark in FIG. 32 indicates the case of Comparative example 1. The plot of ▲ mark in FIG. 32 indicates the case of Comparative example 2.

As is clear from FIG. 32, in Example 1, significantly high output per unit amount can be obtained as compared to comparative examples 1 and 2.

From the above, according to Example 1, namely the above-described embodiments, it is found that the vibration power generating device having good power generation efficiency can be provided.

Further, as is clear from FIG. 32, even though the acceleration of vibration is low in Example 1, significantly high output per unit amount can be obtained as compared to Comparative examples 1 and 2.

From the above, according Example 1, namely the above-described embodiments, it is found that power can be well generated even when the acceleration of vibration is low.

Further, in Example 1, the frequency of oscillations of the oscillating member 114 is about 15 Hz.

On the other hand, in Comparative example 1, the frequency of oscillations of the oscillating member 214 is about 43 Hz. Further, in Comparative example 2, the frequency of oscillations of the oscillating member 314 is about 79 Hz.

From the above, according to Example 1, namely the above-described embodiments, it is found that power can be well generated even when the low frequency of oscillations is low.

Modified Embodiment

The present embodiments have been explained along the above-described embodiments, but the present embodiments are not limited to these. It is obvious for those skilled in the art that, for example, various modifications, improvements, combinations, and so on are possible.

For example, as the weights 13 and 33, a magnet may also be used. When a magnet is used as the weights 13 and 33, a nonmagnetic material is preferably used as the material of the caps 17 and 37.

According to the disclosed power generating devices, the magnetostrictive layer is stacked above the tough layer, thereby making it possible to achieve improvement of the toughness of the oscillating member including the magnetostrictive layer. Therefore, it is possible to add large deformations to the magnetostrictive layer and further to uniformly cause stain in the whole magnetostrictive layer, so that it is possible to improve power generation efficiency. Further, the oscillating member can be formed thinly, so that it is possible to correspond to low vibration frequencies and low vibration acceleration and to provide the power generating device having a significantly wide application range.

The power generating devices according to the present embodiments are useful for achieving improvement of power generation efficiency and the like.

All examples and conditional language provided herein are intended for the pedagogical purposes of siding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power generating device, comprising:
   an oscillating member, the oscillating member comprising:
     a tough layer, and
     a magnetostrictive layer that is stacked above the tough layer and is formed of a magnetostrictive material, the tough layer formed of a tough material having a tensile strength higher than that of the magnetostrictive material;
   a supporting member to which the oscillating member is attached to be able to oscillate in the thickness direction;
   a magnetic field applying member that applies a magnetic field to the magnetostrictive layer; and
   a coil that is disposed around the magnetostrictive layer,
   wherein a recessed portion is formed in a surface of the supporting member and the oscillating member projects above the recessed portion at the tip side of the oscillating member.

2. The power generating device according to claim 1, wherein the tough layer is formed thicker than the magnetostrictive layer.

3. The power generating device according to claim 1, wherein the magnetostrictive layer has a thickness of 1000 µm or less.

4. The power generating device according to claim 1, wherein the tough layer has a thickness of 1000 µm or less.

5. The power generating device according to claim 1, wherein the tough material has a tensile strength of 1000 MPa or more.

6. The power generating device according to claim 1, wherein the tough material has a Young's modulus of 150 GPa or less.

7. The power generating device according to claim 1, wherein the tough material has elastic limit elongation of 0.5% or more.

8. The power generating device according to claim 1, wherein the tough material is metallic glass or GUM-METAL (registered trademark).

9. The power generating device according to claim 1, wherein the tough material is a superelastic alloy.

10. The power generating device according to claim 1, wherein the tough material is silicon.

11. The power generating device according to claim 1, wherein the tough material is ceramics.

12. The power generating device according to claim 1, wherein the tough material is a polymeric material.

13. The power generating device according to claim 1, wherein the coil is formed integrally with the oscillating member.

14. The power generating device according to claim 13, wherein the coil is wound around the magnetostrictive layer and has a lower portion thereof disposed between the tough layer and the magnetostrictive layer.

15. The power generating device according to claim 13, wherein the coil includes a plane ladder coil disposed at least above or below the magnetostrictive layer.

16. The power generating device according to claim 15, wherein the plane ladder coil is disposed below the magnetostrictive layer and is disposed between the tough layer and the magnetostrictive layer.

17. The power generating device according to claim 1, wherein
   the oscillating member further comprises insulating layers surrounding the magnetostrictive layer, and
   the coil is buried in the insulating layers.

18. The power generating device according to claim 1, wherein the magnetic field applying member doubles as a package member covering the oscillating member.

19. The power generating device according to claim 18, wherein the container has an inside thereof brought into a vacuum or reduced pressure state.

20. The power generating device according to claim 1, further comprising:
a container that houses the oscillating member therein, wherein the coil is wound around the container.

21. The power generating device according to claim 1, wherein a weight is attached to the oscillating member.

22. The power generating device according to claim 21, wherein the weight is a magnet.

23. The power generating device according to claim 21, wherein the weight is formed at a tip side of the oscillating member.

\* \* \* \* \*